(12) United States Patent
Fujii et al.

(10) Patent No.: US 8,338,298 B2
(45) Date of Patent: Dec. 25, 2012

(54) METHOD AND APPARATUS FOR MANUFACTURING SEMICONDUCTOR INTEGRATED CIRCUIT DEVICE

(75) Inventors: Kazuyuki Fujii, Tokyo (JP); Toshihiko Minami, Tokyo (JP); Hideaki Kanazawa, Tokyo (JP)

(73) Assignee: Renesas Electronics Corporation, Kanagawa (JP)

(*) Notice: Subject to any disclaimer, the term of this patent is extended or adjusted under 35 U.S.C. 154(b) by 591 days.

(21) Appl. No.: 12/556,027

(22) Filed: Sep. 9, 2009

(65) Prior Publication Data

US 2010/0087064 A1    Apr. 8, 2010

(30) Foreign Application Priority Data

Oct. 8, 2008    (JP) .................................. 2008-261310

(51) Int. Cl.
*H01L 21/285*    (2006.01)

(52) U.S. Cl. ......... 438/680; 438/674; 438/676; 118/715

(58) Field of Classification Search .................. 438/680, 438/674, 676; 118/715, 723
See application file for complete search history.

(56) References Cited

U.S. PATENT DOCUMENTS

| | | | | |
|---|---|---|---|---|
| 5,292,393 A | * | 3/1994 | Maydan et al. | 156/345.32 |
| 6,026,762 A | * | 2/2000 | Kao et al. | 118/723 ME |
| 6,351,683 B1 | * | 2/2002 | Johnson et al. | 700/121 |
| 6,442,736 B1 | * | 8/2002 | Girard et al. | 716/54 |
| 2005/0188922 A1 | * | 9/2005 | Ishibashi et al. | 118/723 I |
| 2006/0234398 A1 | * | 10/2006 | Gluschenkov et al. | 438/5 |
| 2007/0056515 A1 | * | 3/2007 | Chevalier et al. | 118/723 I |

FOREIGN PATENT DOCUMENTS

| | | |
|---|---|---|
| JP | 2003-243367 A | 8/2003 |
| JP | 2004-288849 A | 10/2004 |
| JP | 2005-209935 A | 8/2005 |
| JP | 2005-277397 A | 10/2005 |

* cited by examiner

*Primary Examiner* — Thinh T Nguyen
(74) *Attorney, Agent, or Firm* — Mattingly & Malur, PC

(57) ABSTRACT

The present inventors have found that a wafer process of VLSI (Very Large Scale Integration) has the following problem, that is, generation of foreign matters due to moisture from a wafer as a result of degassing when a barrier metal film or a first-level metal interconnect layer is formed by sputtering as a preliminary step for the formation of a tungsten plug in a pre-metal step. To overcome the problem, the present invention provides a manufacturing method of a semiconductor integrated circuit device including, in a plasma process, in-situ monitoring of moisture in a processing chamber by receiving an electromagnetic wave generated from plasma.

10 Claims, 19 Drawing Sheets

METHOD AND APPARATUS FOR MANUFACTURING SEMICONDUCTOR INTEGRATED CIRCUIT DEVICE

CROSS-REFERENCE TO RELATED APPLICATIONS

The disclosure of Japanese Patent Application No. 2008-261310 filed on Oct. 8, 2008 including the specification, drawings and abstract is incorporated herein by reference in its entirety.

BACKGROUND OF THE INVENTION

The present invention relates to a technology effective when applied to gas monitoring technology in gas-phase plasma processing employed in a manufacturing method of a semiconductor integrated circuit device (or a semiconductor device).

Japanese Unexamined Patent Publication No. 2005-209935 (Patent Document 1) discloses a technology of disposing a current probe in a high-frequency power supply line of a gas phase plasma processing apparatus to confirm electric discharge in a processing chamber.

Japanese Unexamined Patent Publication No. 2004-288849 (Patent Document 2) and Japanese Unexamined Patent Publication No. 2003-243367 (Patent Document 3) disclose a technology of monitoring abnormal discharge in a processing chamber of a gas-phase plasma processing apparatus by using a receiving antenna arranged outside an observation window on the side surface of the chamber.

Japanese Unexamined Patent Publication No. 2005-277397 (Patent Document 4) or US Patent No. 2005-0188922 (Patent Document 5) discloses a technology of, in monitoring abnormal discharge in a processing chamber of a gas-phase plasma processing apparatus by using a receiving antenna arranged outside an observation window on the side surface of the chamber, inserting a dielectric material into the observation window and thereby improving propagation properties of electromagnetic waves.

[Patent Document 1]
Japanese Unexamined Patent Publication No. 2005-209935
[Patent Document 2]
Japanese Unexamined Patent Publication No. 2004-288849
[Patent Document 3]
Japanese Unexamined Patent Publication No. 2003-243367
[Patent Document 4]
Japanese Unexamined Patent Publication No. 2005-277397
[Patent Document 5]
US Patent No. 2005-0188922

SUMMARY OF THE INVENTION

The present inventors have found that the wafer process for VLSI (Very Large Scale Integration) has the following problem, that is, generation of foreign matters due to moisture released from a wafer upon degassing when a barrier metal film is formed by sputtering or a first-level metal interconnect layer is formed by sputtering prior to formation of a tungsten plug in a premetal process.

The present invention is made with a view to overcoming the above problem.

An object of the present invention is to provide a highly reliable manufacturing process of a semiconductor integrated circuit device.

The aforementioned and other objects and novel features of the present invention will be apparent from the description herein and accompanying drawings.

Of the inventions disclosed by the present application, a typical one will next be outlined briefly.

In short, the present invention relates to, in a plasma process in a manufacturing step of a semiconductor integrated circuit device, in situ monitoring of moisture in a process chamber by using an antenna arranged outside the chamber to receive electromagnetic waves generated from plasma.

An advantage available by the typical invention, of the inventions disclosed by the present application, will next be described briefly.

In short, moisture generated during plasma processing can be detected directly so that a degassing step which precedes a plasma processing step can be evaluated more precisely.

DETAILED DESCRIPTION OF THE PREFERRED EMBODIMENTS

[Outline of Embodiments]

Figure 1:
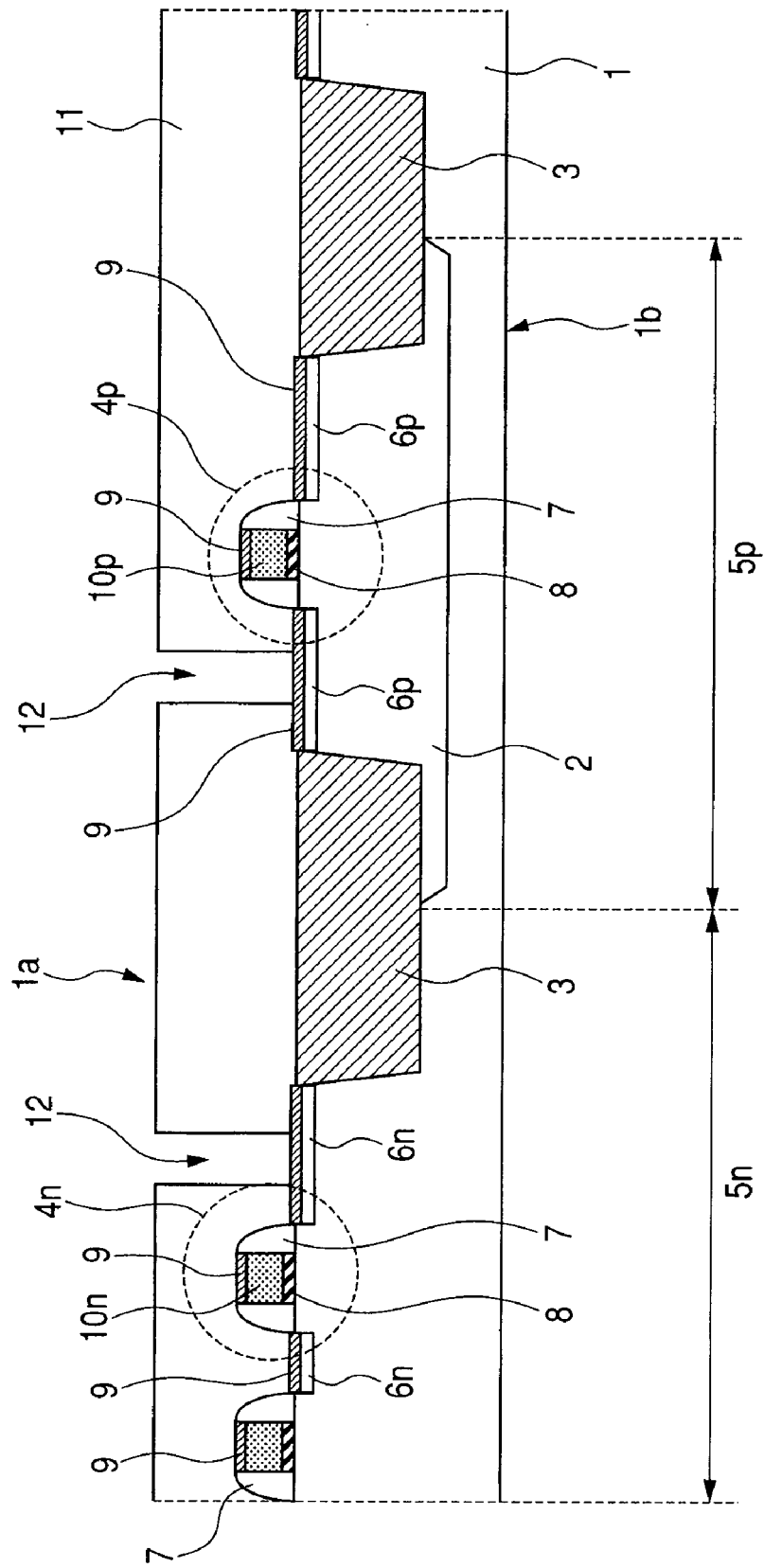
FIG. 1 is a cross-sectional flow diagram of a device in a manufacturing method of a semiconductor integrated circuit device according to one embodiment (first embodiment, which will equally apply hereinafter) of the present application (upon completion of contact hole formation)

First, typical embodiments of the present invention disclosed by the present application will be outlined.

1. A method for manufacturing a semiconductor integrated circuit device including the steps of: (a) introducing a wafer in a first processing chamber; and (b) after the step (a), exciting plasma in the first processing chamber to carry out gas phase processing of the wafer, wherein in the step (b), moisture in the first processing chamber is monitored by receiving, through an antenna arranged outside the first processing chamber, radio waves generated from the plasma in the first processing chamber.

2. The method for manufacturing a semiconductor integrated circuit device as described above in Item 1, wherein the first processing chamber is in a multi-chamber type wafer processing apparatus.

3. The method for manufacturing a semiconductor integrated circuit device as described above in Item 1 or 2, further including the steps of: (c) prior to the step (a), introducing the wafer in a second processing chamber in the multi-chamber type wafer processing apparatus; and (d) after the step (c) but prior to the step (a), subjecting the wafer to degas processing in the second processing chamber.

4. The method for manufacturing a semiconductor integrated circuit device as described above in any one of Items 1 to 3, wherein the gas phase processing is sputtering film-formation processing.

5. The method for manufacturing a semiconductor integrated circuit device as described above in any one of Items 1 to 4, wherein the gas phase processing is sputtering film-formation processing of a metal film.

6. The method for manufacturing a semiconductor integrated circuit device as described above in Item 5, wherein the metal film has, as a principal component thereof, a component selected from the group comprised of titanium, tungsten, tantalum, and ruthenium, and nitrides thereof.

7. The method for manufacturing a semiconductor integrated circuit device as described above in Item 5, wherein the metal film has, as a principal component thereof, titanium or a nitride thereof.

8. The method for manufacturing a semiconductor integrated circuit device as described above in Item 5, wherein the metal film has, as a principal component thereof, tungsten or a nitride thereof.

9. The method for manufacturing a semiconductor integrated circuit device as described above in any one of Items 1 to 8, wherein the band range of the radio waves is 1 GHz or greater but not greater than 6 GHz.

10. The method for manufacturing a semiconductor integrated circuit device as described above in any one of Items 1 to 9, wherein the radio waves have a pulse duration of 5 microseconds or less.

11. The method for manufacturing a semiconductor integrated circuit device as described above in any one of 1 to 10, wherein the radio waves have a pulse duration of 100 microseconds or less.

12. A method for manufacturing a semiconductor integrated circuit device including the steps of: (a) introducing a wafer in a degas processing chamber in a multi-chamber type wafer processing apparatus; (b) after the step (a), carrying out degas processing of the wafer in the degas processing chamber; (c) after the step (b), transferring, through the wafer processing apparatus, the wafer into a sputtering film-formation processing chamber in the wafer processing apparatus; and (d) after the step (c), exciting plasma in the sputtering film-formation chamber and thereby carrying out sputtering to form a metal film over a first main surface of the wafer, wherein in the step (d), moisture in the sputtering film-formation processing chamber is monitored by receiving, through an antenna arranged outside the sputtering film-formation processing chamber, radio waves generated from the plasma in the sputtering film-formation processing chamber.

13. The method for manufacturing a semiconductor integrated circuit device as described above in Item 12, wherein the metal film has, as a principal component thereof, a component selected from the group comprised of titanium, tungsten, tantalum, and ruthenium, and nitrides thereof.

14. The method for manufacturing a semiconductor integrated circuit device as described above in Item 12, wherein the metal film has, as a principal component thereof, titanium or a nitride thereof.

15. The method for manufacturing a semiconductor integrated circuit device as described above in Item 12, wherein the metal film has, as a principal component thereof, tungsten or a nitride thereof.

16. The method for manufacturing a semiconductor integrated circuit device as described above in any one of Items 12 to 15, wherein the band range of the radio waves is 1 GHz or greater but not greater than 6 GHz.

17. The method for manufacturing a semiconductor integrated circuit device as described above in any one of Items 12 to 16, wherein the radio waves have a pulse duration of 5 microseconds or less.

18. The method for manufacturing a semiconductor integrated circuit device as described above in any one of Items 12 to 17, wherein the radio waves have a pulse duration of 100 microseconds or less.

19. An apparatus for manufacturing a semiconductor integrated circuit device including: (a) a wafer processing chamber; (b) a plasma excitation mechanism for exciting plasma in the wafer processing chamber; (c) a receiving antenna for receiving radio waves generated from the plasma, which antenna is arranged outside the wafer processing chamber; and (d) a moisture signal extractor for extracting, from signals from the receiving antenna, a signal component derived from moisture in the wafer processing chamber.

20. The apparatus for manufacturing a semiconductor integrated circuit device as described above in Item 19, wherein the receiving antenna is arranged in the vicinity of a portion of an external wall of the wafer processing chamber permitting substantial passage therethrough of the signal component of the radio waves derived from moisture.

[Explanation of Description Manner, Basic Terms, and Usage in the Present Application]

1. In the present application, a description in the embodiments described below will be made after divided in plural sections if necessary for convenience's sake. These plural sections are not independent each other, but they may each be a part of a single example or one of them may be a partial detail of the other or a modification example of a part or whole of the other one unless otherwise specifically indicated. In principle, description on a portion similar to that described before is not repeated. Moreover, when a reference is made to constituent elements, they are not essential unless otherwise specifically indicated, limited to the number theoretically, or principally apparent from the context that it is not.

2. With regard to any material, any composition or the like in the description of embodiments, the term "X made of A" or the like does not exclude X having, as a main constituent component thereof, an element other than A unless otherwise specifically indicated or principally apparent from the context it is not. For example, the term "X made of A" means that "X has, as a main component thereof, A". It is needless to say that, for example, the term "silicon member" is not limited to a member made of pure silicon but also a member containing a SiGe alloy or another multi-element alloy having silicon as a main component, an additive, and the like. Similarly, it is needless to say that the term "silicon oxide film" means not only a relatively pure undoped silicon dioxide film but also a FSG (fluorosilicate glass) film, a TEOS-based silicone oxide film, a SiOC (silicon oxycarbide) film, a carbon-doped silicon oxide film, a thermal oxidation film such as OSG (organosilicate glass) film, PSG (phosphorus silicate glass) film, or BPSG (borophosphosilicate glass) film, a CVD oxide film, silicon oxide films obtained by method of application such as SOG (spin on glass) and NSC (nano-clustering silica) films, silica-based low-k insulating films (porous insulating films) obtained by introducing pores into similar members thereto, and composite films with another silicon-based insulating film which films contain any one of the above-mentioned films as a principal constituent element.

Similarly, the term "aluminum-based interconnect", "aluminum interconnect", "tungsten-based interconnect" or the like means not a relatively pure interconnect but an interconnect having aluminum, tungsten, or the like as a main component. This will also apply to the term "barrier metal", "anti-reflective film", or the like.

3. Preferred examples of the shape, position, attribute and the like will be shown, however, it is needless to say that they are not strictly limited to the preferred examples unless otherwise specifically indicated or apparent from the context that it is not.

4. When a reference is made to a specific number or amount, the number or amount may be greater than or less than the specific number or amount unless otherwise specifically indicated, limited to the specific number or amount theoretically, or apparent from the context that it is not.

5. The term "wafer" usually means a single crystal silicon wafer over which a semiconductor integrated circuit device (which may be a semiconductor device or an electronic device) is to be formed. It is however needless to say that it embraces a composite wafer of an insulating substrate with a semiconductor layer such as epitaxial wafer, SOI substrate and LCD glass substrate.

6. The term "radio waves" means electromagnetic waves having a wavelength of 100 μm or greater. Rotational spectrum of water molecules to be treated in the present application is presumed to be usually in a frequency zone of 1 GHz or greater but not greater than 6 GHz.

7. The term "sputtering film-formation processing" means processing in which an argon ion or the like is made to collide with a sputtering target having almost the same composition as that of a film to be formed or a principal composition of the film in a high vacuum and a target component emitted or a reaction product thereof is deposited on a wafer or the like to be processed.

8. The term "degas processing" means retention of a wafer to be processed or the like in a high vacuum while heating it in order to release (degas) a component such as moisture adsorbed to the wafer before high vacuum processing such as sputtering film-formation processing.

9. The term "abnormal discharge" in a plasma apparatus means intermittent discharge between plasma and a chamber wall or an installed member in the chamber. Accordingly, an electric current inside the plasma does not mean abnormal discharge.

[Details of Embodiments]

Embodiments will next be described more specifically. In all the drawings, the same or like members will be identified by the same or like symbols or reference numerals and overlapping descriptions will be omitted in principle.

1. Explanation of a multi-chamber type wafer processing and film formation apparatus to be used in the manufacturing method of a semiconductor integrated circuit device according to each embodiment of the present application (referring to mainly FIGS. 14 to 16)

Figure 14:
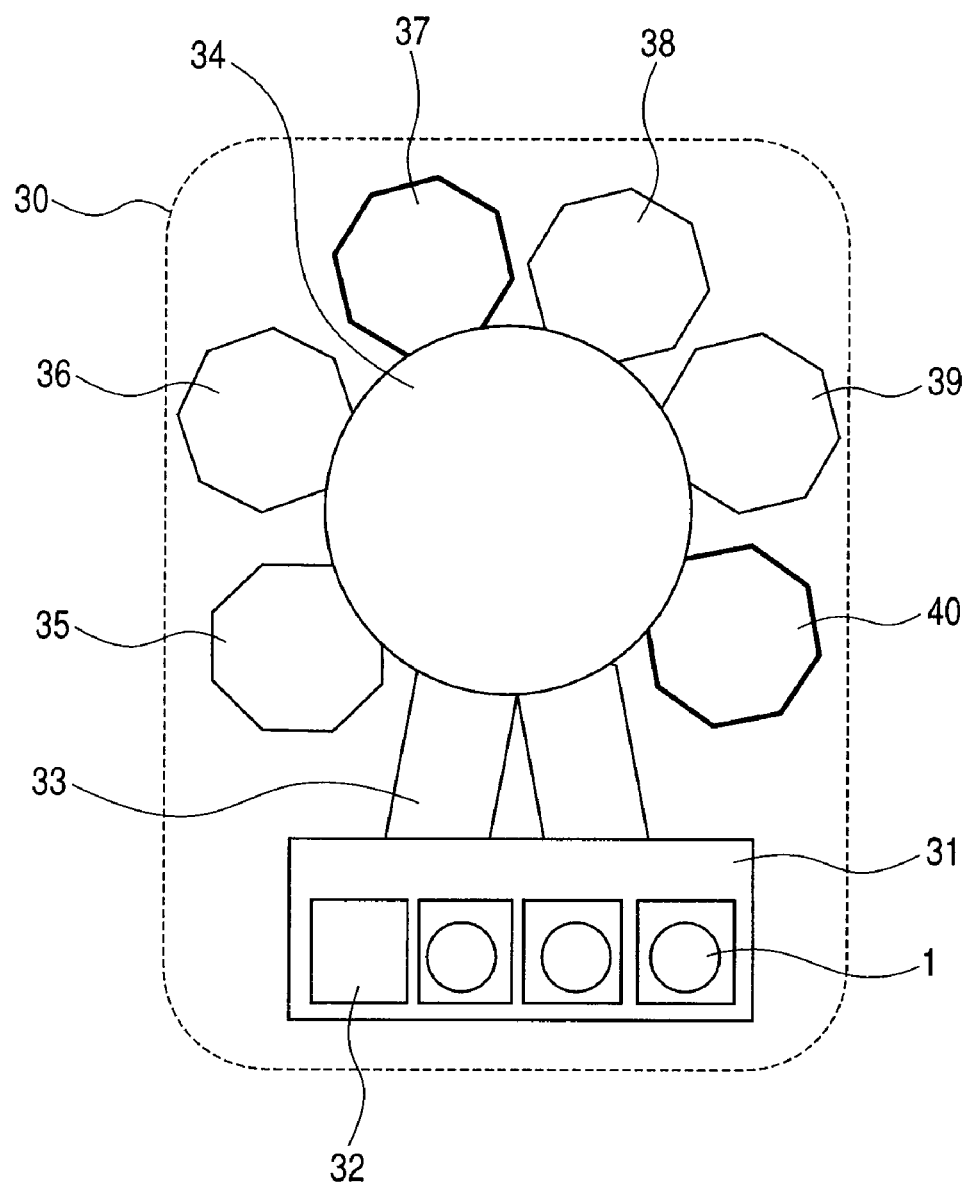
FIG. 14 is a plan view of an apparatus illustrating the configuration of chambers of a multi-chamber type wafer processing and film-forming apparatus to be used for the manufacturing method of a semiconductor integrated circuit device according to each embodiment of the present application.

First, a description is made on a manufacturing apparatus of a semiconductor integrated circuit device to be used in Sections 2 and 3 (here, the description is made with Section 2 in mind) which will be described below. FIG. 14 is a plan view of the multi-chamber type wafer processing apparatus 30 having a plurality of wafer processing chambers for carrying out gas phase processing (degas processing, sputtering film formation, CVD processing, etching, and the like) of a wafer 1. In the process described in Section 3, one of these chambers may be used for aluminum sputtering film formation. Of course, another apparatus may be used for aluminum sputtering film formation. In addition, etching is performed in a separate apparatus, but may be performed in the same apparatus. Moreover, sputtering film formation and CVD processing may be performed in the same apparatus but they may be performed in respective apparatuses. Similarly, titanium sputtering film formation and titanium-nitride sputtering film formation may be performed in the respective chambers of the same apparatus, but they may be performed in the same chamber successively. Outline of the structure and operation of the multi-chamber type wafer processing apparatus 30 will next be described.

As illustrated in FIG. 14, the wafer 1 to be processed is placed on a load port 31 while being housed in a wafer container 32. The wafer 1 passes through a load lock chamber 33 and a vacuum transfer chamber 34 (transportation using a vacuum transfer robot) and is then transported to one of a degas processing chamber 35 (second processing chamber), a titanium sputtering film-formation processing chamber 36 (processing chamber or first processing chamber), a titanium-nitride sputtering film-formation processing chamber 37 (processing chamber or first processing chamber), a titanium-nitride CVD chamber 38, a tungsten CVD chamber 39, and a tungsten sputtering chamber 40 (processing chamber or first processing chamber). The wafer is transported among the chambers 35, 36, 37, 38, 39, and 40 via the vacuum transfer chamber 34 (transportation using the vacuum transfer robot). The wafer 1 is carried out in reverse order. It is carried out after passing through the vacuum transfer chamber 34 (transportation using the vacuum transfer robot) and the load lock chamber 33.

The sputtering film-formation processing chamber 37 (40) and peripheral structure thereof will next be described referring to FIG. 15 (they will be described with titanium-nitride sputtering film-formation processing as an example). In this example, a receiving antenna 51 is attached to the titanium-nitride sputtering film-formation processing chamber 37 or the tungsten sputtering chamber 40, but the receiving antenna 51 may be attached to any of the degas processing chamber 35, the titanium sputtering film-formation processing chamber 36, the titanium-nitride CVD chamber 38, the tungsten CVD chamber 39, another sputtering film-formation processing chamber, dry etching chamber, and another gas-phase processing chamber.

Figure 15:
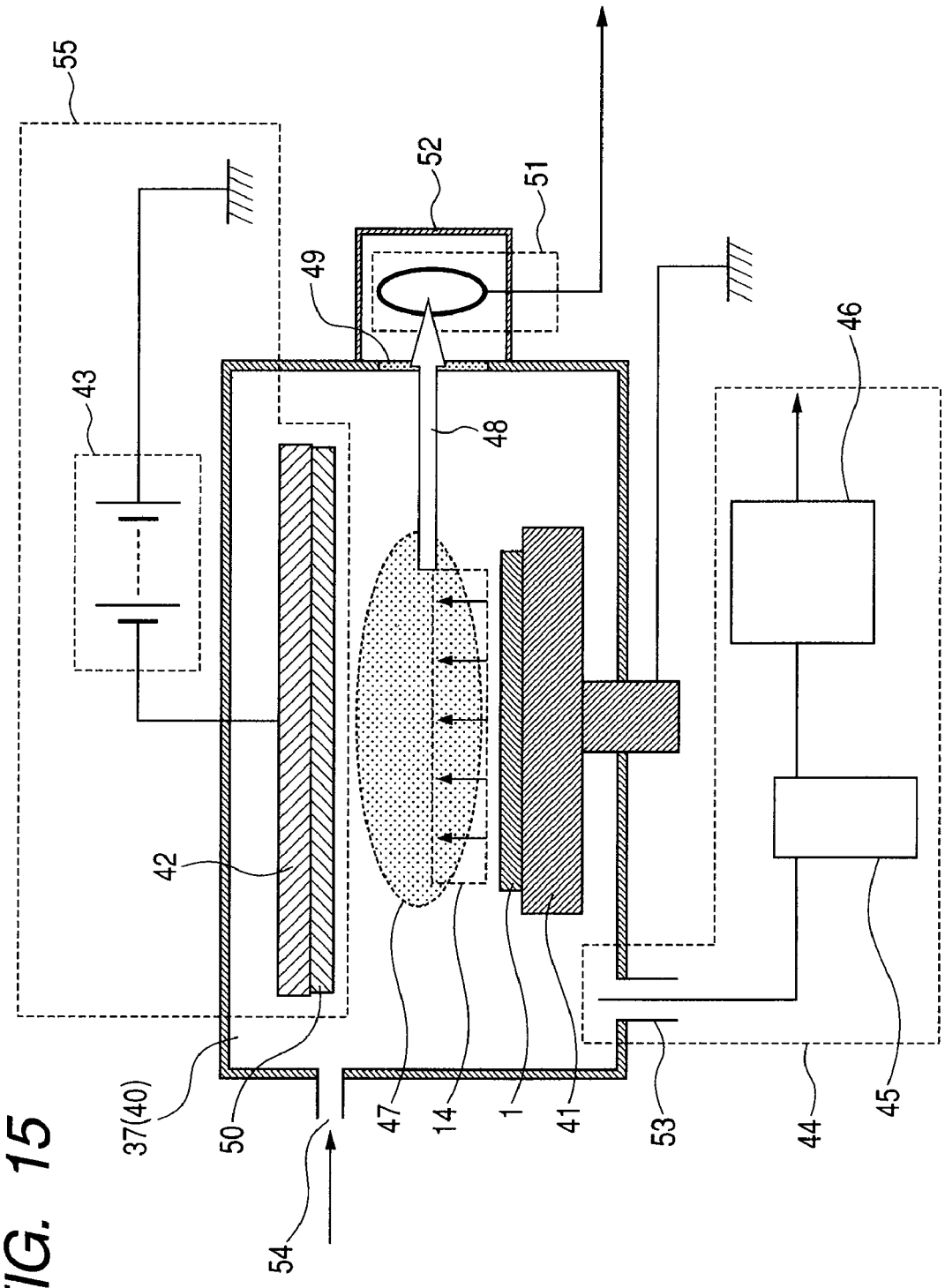
FIG. 15 is a schematic cross-sectional view illustrating the structure of the sputtering film-formation chamber of the multi-chamber type wafer processing and film-forming apparatus to be used for the manufacturing method of a semiconductor integrated circuit device according to each embodiment of the present application.

As illustrated in FIG. 15, the processing chamber 37 has, inside thereof, a wafer stage 41 (lower electrode) for placing the wafer 1 thereon. The wafer stage 41 is usually grounded. An upper electrode 42 for supporting Titanium target 50 (in the case of titanium-nitride sputtering film-formation processing) is arranged opposite to the wafer stage 41. The upper electrode 42 is supplied with a bias from DC bias power supply 43. These the upper electrode 42 and DC bias power supply 43 configure Plasma excitation mechanism 55. When a titanium nitride film is formed, a nitrogen gas is supplied from Gas inlet port 54. The processing chamber 37 is kept under high vacuum by Vacuum exhaust system 44 comprised of a cryopump 45 coupled to an exhaust port 53, a mechanical roughening pump 46, and the like. When moisture is released (degassing 14 occurs) from the wafer 1 during sputtering film formation, radio waves (electromagnetic waves) 48 are emitted from Plasma 47, pass through an observation window 49 made of quartz glass or the like, and are received by the receiving antenna 51 in an antenna shield 52.

Figure 16:
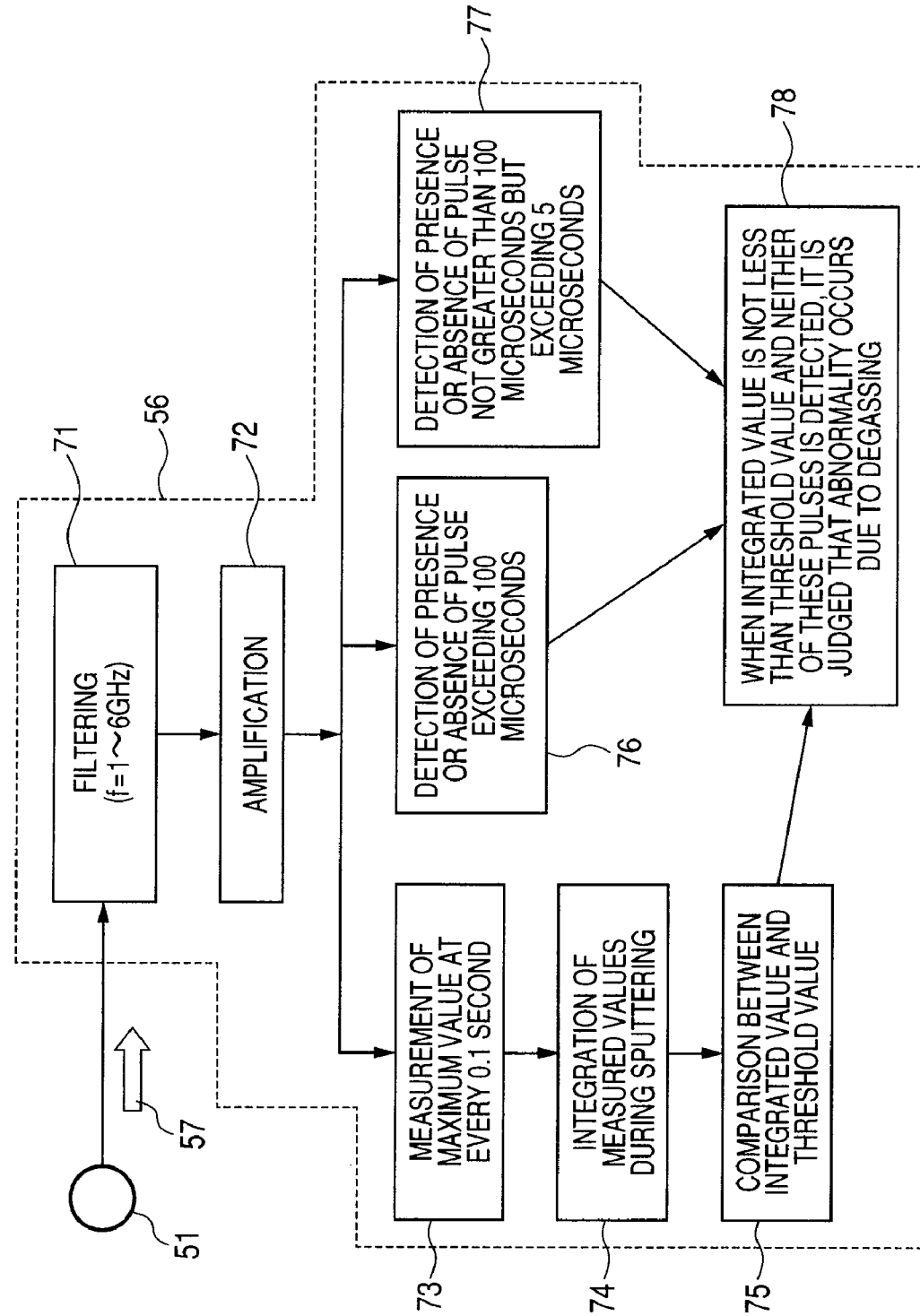
FIG. 16 is a block flow chart illustrating the outline of signal processing in moisture monitoring upon film formation by sputtering in the manufacturing method of a semiconductor integrated circuit device according to each embodiment of the present application.

Referring to FIG. 16, processing of a received signal 57 received by the receiving antenna 51 will next be described. As illustrated in FIG. 16, the received signal 57 is loaded in a moisture signal extractor 56 and processed in the following manner. First, radio waves of an unnecessary band are removed by filtering processing 71. Only radio waves within a band range of about 1 GHz or greater but not greater than 6 Hz are allowed to pass because the rotational emission spectrum of water molecules falls within this range. Then, the received signal 57 is subjected to amplification processing 72, divided into three signals (first branched signal, second branched signal, and third branched signal) and then subjected to parallel processing as described below. The first branched signal is subjected to maximum-value measurement processing 73 by which the maximum value is measured, for example, for an interval of 0.1 second, followed by integration processing 74 by which maximum values during a sputtering time are integrated. Comparison processing 75 in which an integrated value is compared with an appropriate threshold value (for example, an integrated value determined by the same processing of a sufficiently degassed wafer) is performed. When the integrated value is greater than the threshold value, a signal suggesting "presence of moisture" is output. The second and third branched signals are, on the other hand, subjected to conformation processing 76 of a signal having a long pulse duration due to abnormal discharge and conformation processing 77 of a signal having an intermediate pulse duration due to abnormal discharge, whereby the presence or absence of a pulse having a pulse duration exceeding 100 microseconds and presence or absence of a pulse duration exceeding 5 microseconds (but not greater than 100 microseconds) are judged, respectively. They are carried out because it is usually presumed that a pulse signal derived from moisture has a pulse duration not greater than 5 microseconds (quantum mechanical microscopic phenomenon) and a radiation pulse due to abnormal discharge has a pulse duration exceeding 100 microseconds (macroscopic phenomenon similar to lightening). The presence or absence of signals having a pulse duration between 5 microseconds and 100 microseconds is considered (not essential) in order to confirm presence or absence of radiation due to various intermediate reasons.

In consideration of processing results of the first, second, and third branched signals thus obtained, when the integrated value is the threshold value or greater and at the same time, long pulse-duration signals (long pulse-duration and intermediate pulse-duration signals) are not detected, it is judged that the received signal 57 is derived from moisture. The results of Confirmation processing 77 of a signal having an intermediate pulse duration due to abnormal discharge may be neglected.

When release of moisture from the wafer 1, that is, degassing of the wafer 1 is detected during film formation by sputtering, feedback processing is performed, for example, by changing processing conditions of the preceding degassing step as needed (extension of degassing time, elevation of temperature, replacement of a degassing chamber, cleaning, maintenance of a vacuum exhaust system).

There was no practical means capable of directly detecting moisture in a sputtering film-formation chamber itself so that a mass spectroscopy was coupled to an upstream degas processing chamber to indirectly forecast release of moisture from a wafer, that is, degassing of the wafer in the downstream sputtering film-formation chamber. The monitoring method as described above however enables to detect moisture in the sputtering film-formation chamber itself with high accuracy because moisture of the sputtering film-formation chamber itself during mass production can be detected. In addition, the aforementioned signal processing enables to effectively remove noise components due to abnormal discharge so that high-accuracy monitoring (less misinformation) directly applicable to mass production can be achieved.

2. Explanation of cross-sectional flow diagrams (mainly, FIGS. 1 to 11, 14, and 15) of a device in the manufacturing method of a semiconductor integrated circuit device according to one embodiment of the present application (first embodiment "tungsten-based M1 process", which will equally apply hereinafter)

First, a main portion (after completion of a contact hole) of a wafer process having a tungsten-based M1 interconnect is described. As illustrated in FIG. 1, N-well region 2 is formed in a portion of P type silicon single crystal wafer 1 (semiconductor substrate) and along the periphery of the wafer, STI (Shallow Trench Isolation) insulating-film region 3 is formed on First main surface side 1a (on the side of the main surface of the device) of a semiconductor substrate 1. With this STI insulating film region 3, the semiconductor substrate 1 is divided into N-channel region 5n and P-channel region 5p. In N-channel region 5n in a surface region of a device main surface side 1a of the semiconductor substrate 1, N type source/drain regions 6n forming a portion of N-Channel MISFET 4n is placed. In P channel region 5p in a surface region of the device main surface side 1a of the semiconductor substrate 1, on the other hand, P type source/drain regions 6p forming a portion of P-Channel MISFET 4p is placed. These N type source/drain regions 6n and P type source/drain regions 6p have a silicided surface (for example, a nickel monosilicide layer). N-channel MISFET 4n has, in addition, a gate insulating film 8 over the semiconductor substrate 1, N-type polysilicon gate electrode 10n thereover, Silicide layer 9 (for example, a nickel monosilicide layer) thereover, and Side-wall spacer insulating film 7 for surrounding them therewith. Similarly, P-channel MISFET 4p has, in addition to P type source/drain regions 6p, the gate insulating film 8 over the semiconductor substrate 1, P type polysilicon gate electrode 10p over the semiconductor substrate 1, and a side-wall spacer insulating film 7 surrounding them therewith. Moreover, a pre-metal interlayer insulating film 11 is formed so as to cover the device main surface side 1a of the semiconductor substrate 1. The pre-metal interlayer insulating film 11 is usually comprised of a thin nitride silicon film (etch stopper film) as a lower layer and a thick silicon oxide insulating film as an upper layer. Examples of this thick silicon oxide insulating film include silicon oxide insulating films using P-TEOS (plasma-tetraethylorthosilicate). A contact hole 12 (substantially circular minute opening) is formed by dry etching (using a silicon nitride film or the like as an etch stopper film) in a mixed gas having, as a main component thereof, a fluorocarbon-based etching gas ($CF_4$, $CHF_3$, $C_2F_6$, $C_3F_6$, $C_4F_6$, or $C_5F_8$, or a mixed gas thereof), a dilution gas (for example, argon or helium), or another addition gas (for example, oxygen, hydrogen, or carbon dioxide). The silicon nitride film on the bottom of the hole is removed similarly by dry etching in a mixed gas having, as a main component thereof, a fluorocarbon or another etching gas ($CF_4$, $CHF_3$, $NF_3$, or $SF_6$, or a mixed gas thereof), a dilution gas (for example, argon or helium), or another addition gas (for example, oxygen, hydrogen, carbon dioxide, or nitrogen).

When removal of the resist and necessary washing are completed (such a series of patterning treatments will hereinafter be called "typical lithography"), the wafer 1 is housed in the wafer container 32 and transported to a load port of the multi-chamber type wafer processing apparatus 30 (integrated film formation apparatus of FIG. 14).

Figure 2:
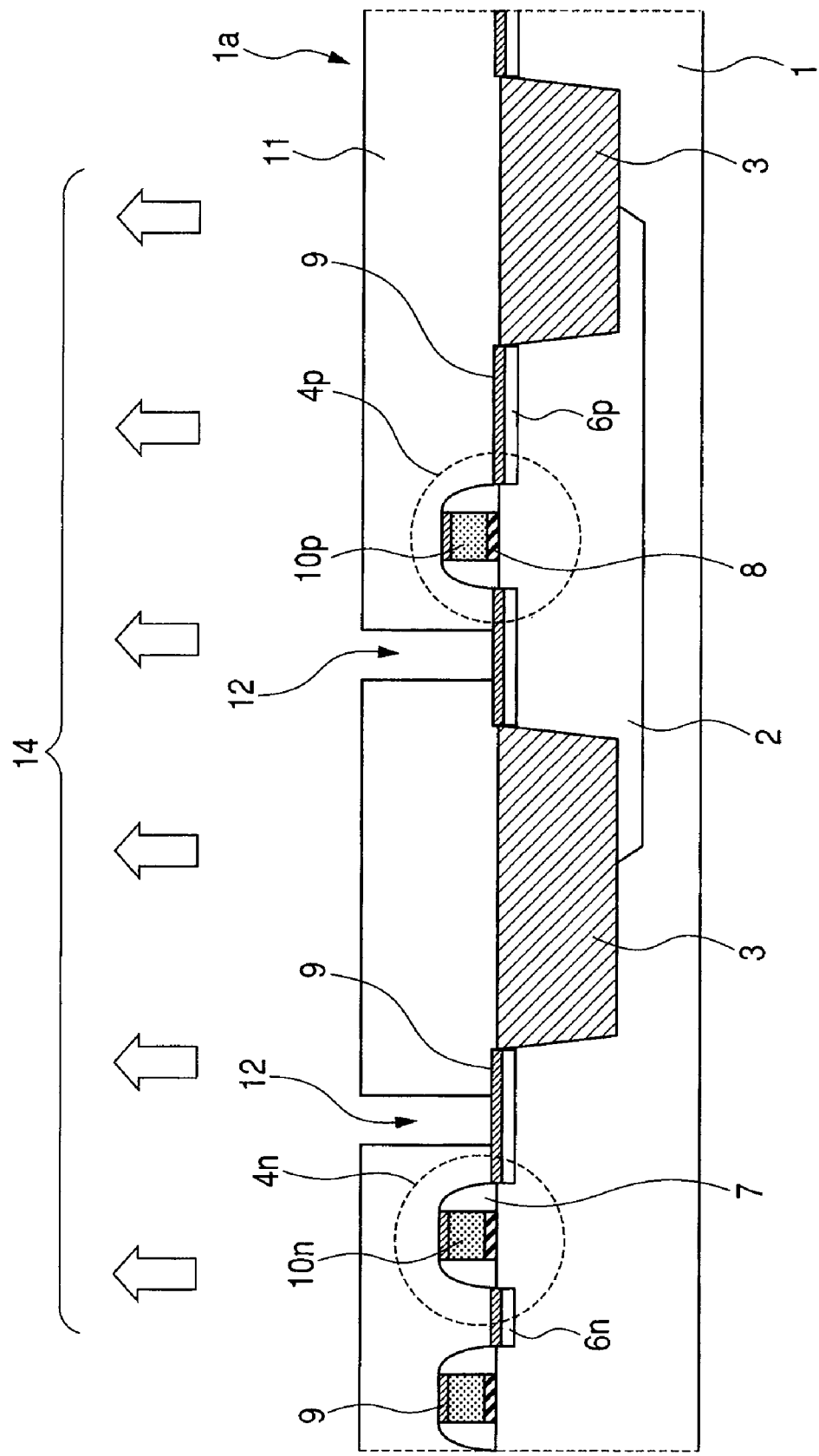
FIG. 2 is a cross-sectional flow diagram of a device in the manufacturing method of a semiconductor integrated circuit device according to the one embodiment of the present application (a degassing step before sputtering for barrier-metal film formation in and out of the contact hole)

The wafer 1 is then transferred to the degas processing chamber 35 in the multi-chamber type wafer processing apparatus 30 (FIG. 14), in which it is subjected to the degas processing 14 as illustrated in FIG. 2. Degas processing is performed, for example, under the following conditions. For example, the wafer 1 is heated with a lamp (achieving temperature of from about 200° C. to 300° C.) for from about 50 to 100 seconds under high vacuum.

Figure 3:
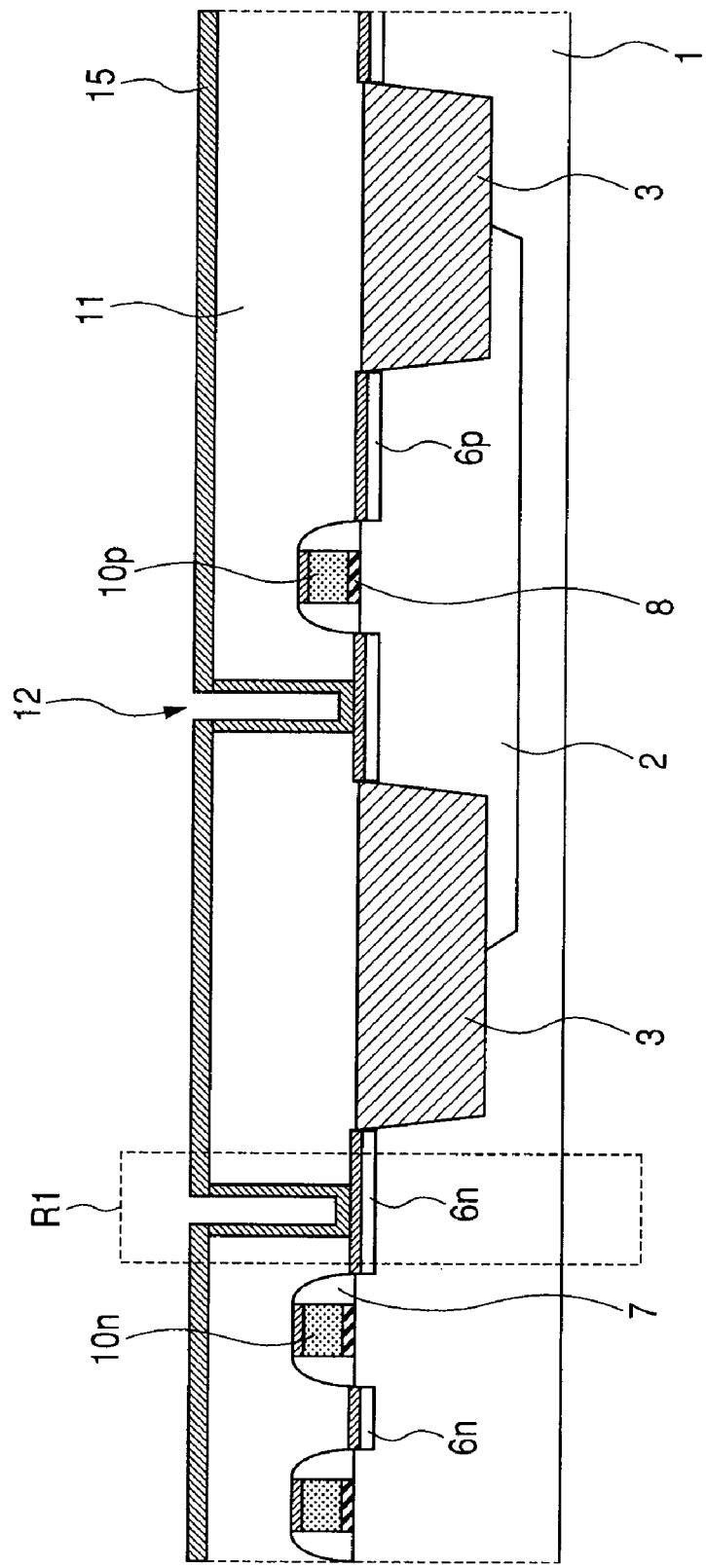
FIG. 3 is a cross-sectional flow diagram of a device in the manufacturing method of a semiconductor integrated circuit device according to the one embodiment of the present application (a step of sputtering for barrier-metal film formation in and out of the contact hole)
Figure 4:
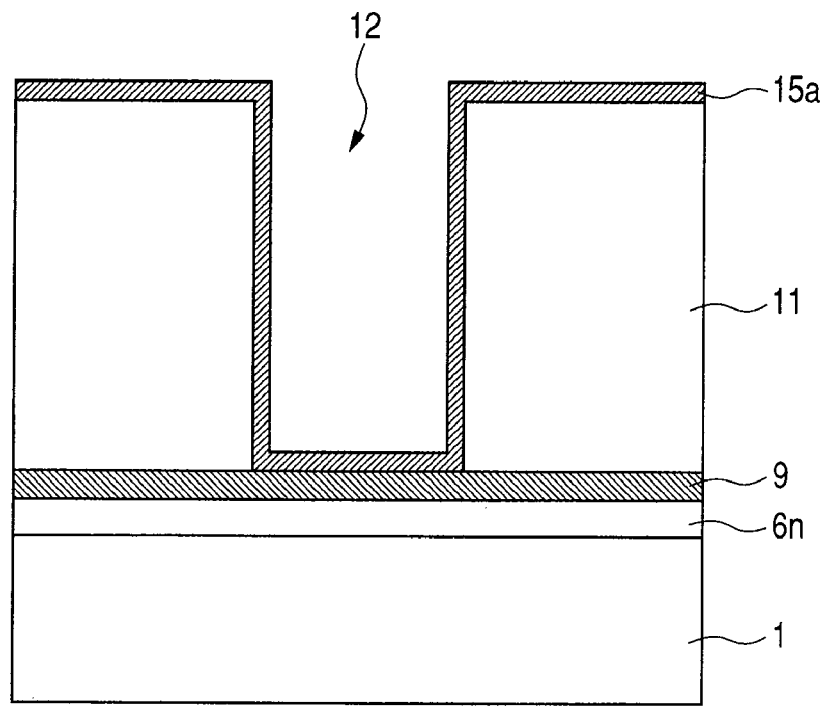
FIG. 4 is an enlarged cross-sectional flow diagram of a device corresponding to the R1 portion of FIG. 3 in the manufacturing method of a semiconductor integrated circuit device according to the one embodiment of the present application (a step of sputtering for forming a titanium film serving as a lower film of the barrier metal film inside and outside of the contact hole)

The wafer 1 is then transferred successively to the processing chambers 36, 37, and 38 to form a barrier metal film 15 as illustrated in FIG. 3. Details of the step of forming this film will next be described referring to FIGS. 4 to 6, that is, enlarged views illustrating a periphery R1 of the contact hole.

Formation of the barrier metal film 15 starts with the formation of a lower titanium film 15a having a thickness of about 10 nm by sputtering film-formation processing in the processing chamber 36 (FIG. 14). The film is formed, for example, under the following conditions: a stage temperature: about 300° C., atmospheric pressure in the chamber: about 47 mPa (0.35 mTorr), flow rate of argon: about 10 sccm, DC power: about 10 KW, and film formation time: about 5 seconds.

Figure 5:
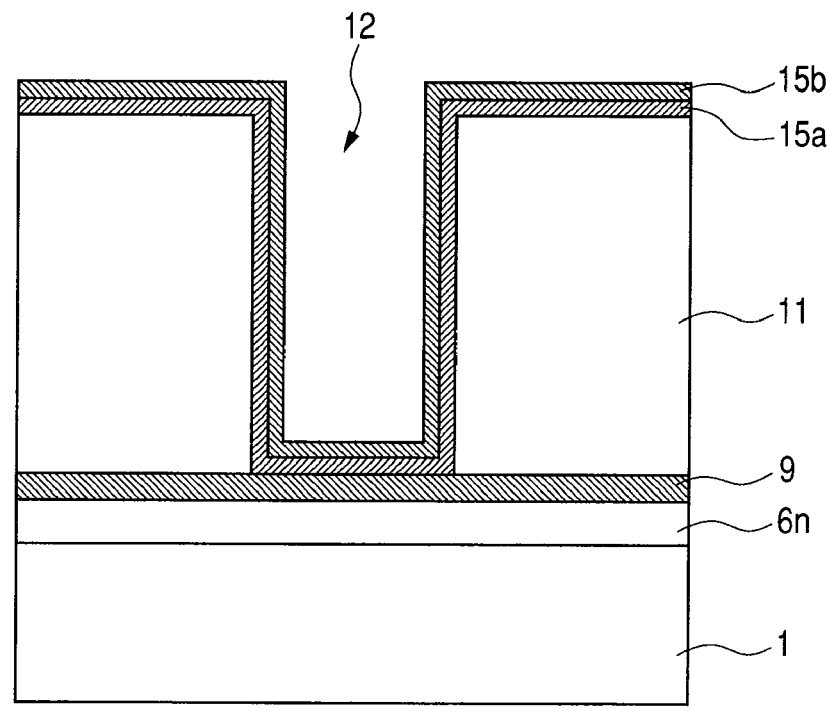
FIG. 5 is an enlarged cross-sectional flow diagram of a device corresponding to the R1 portion of FIG. 3 in the manufacturing method of a semiconductor integrated circuit device according to the one embodiment of the present application (a reactive sputtering step for forming a titanium nitride film, that is, an intermediate film of the barrier metal film inside and outside the contact hole)

Then, as illustrated in FIG. 5, Intermediate titanium nitride film 15b having a thickness of about 10 nm is formed over the lower titanium film 15 by reactive sputtering film-formation processing in the processing chamber 37 (FIG. 14). The film is formed under the following conditions: a stage temperature: about 300° C., atmospheric pressure in the chamber: about 100 mPa (0.8 mTorr), flow rate of argon: about 10 sccm, flow rate of nitrogen: about 30 sccm, DC power: about 13 KW, and film formation time: about 5 seconds.

Figure 6:
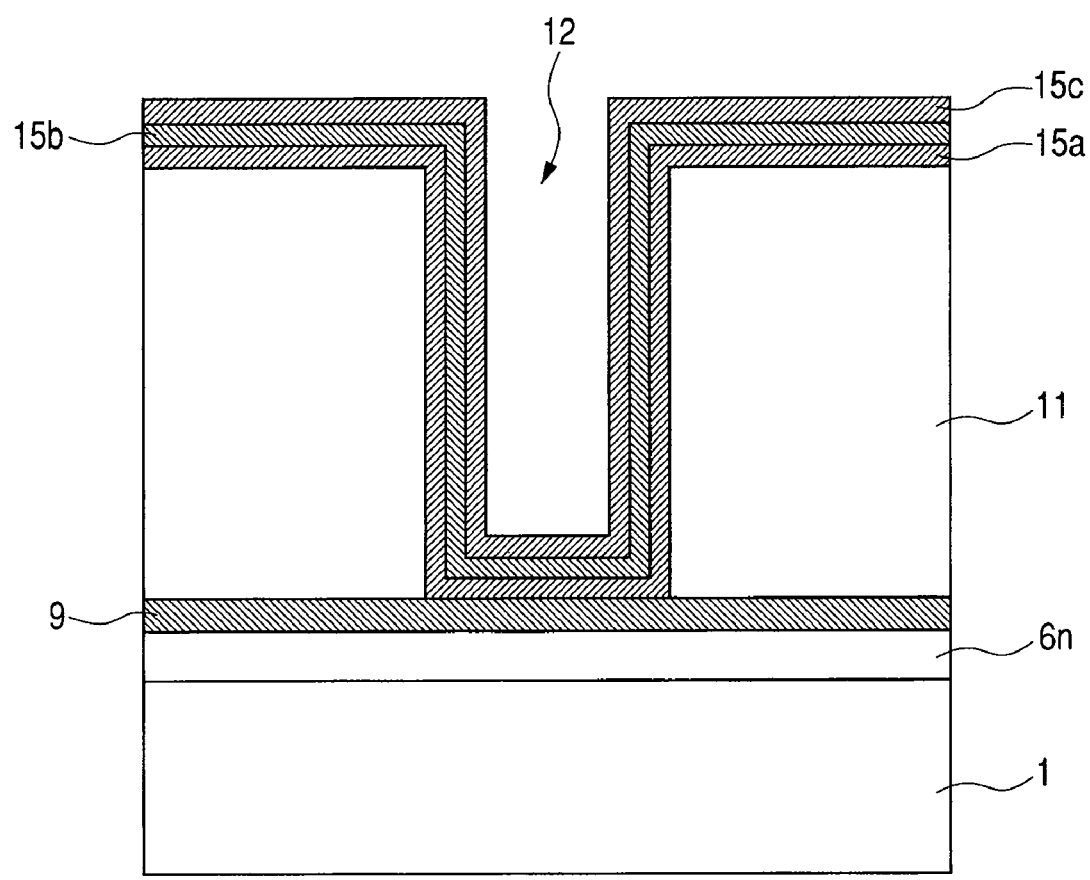
FIG. 6 is an enlarged cross-sectional flow diagram of a device corresponding to the R1 portion of FIG. 3 in the manufacturing method of a semiconductor integrated circuit device according to the one embodiment of the present application (a CVD step for forming a titanium nitride film, that is, an upper layer film of the barrier metal film inside and outside the contact hole)

As illustrated in FIG. 6, an upper titanium nitride film 15c having a thickness of about 20 nm is then formed over Intermediate titanium nitride film 15b by CVD processing in the processing chamber 38 (FIG. 14), whereby formation of a barrier film is completed.

In the processing chamber 40 (FIG. 14), sputtering film-formation processing is then performed to form a thin seed tungsten film over the barrier metal film 15.

Figure 7:
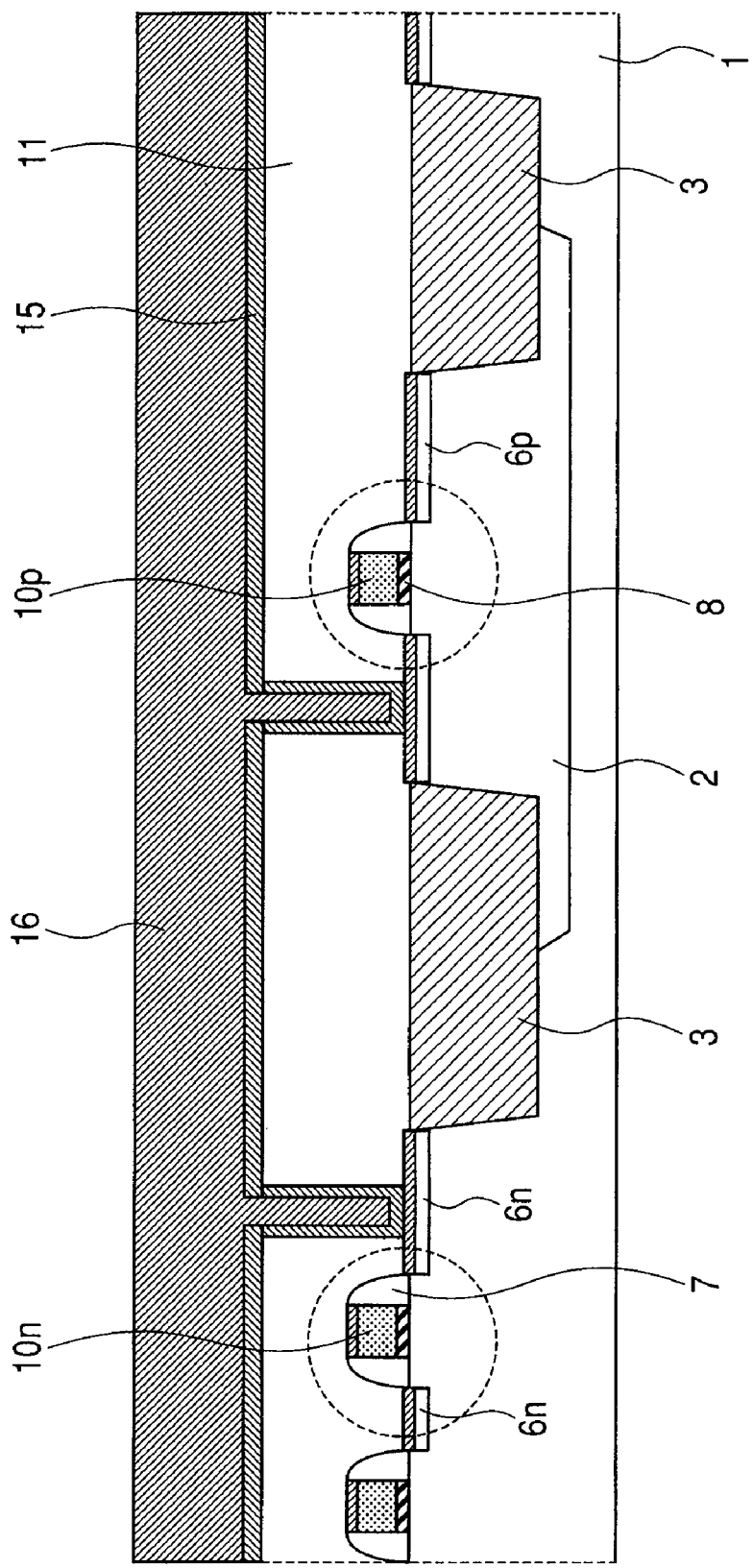
FIG. 7 is a cross-sectional flow diagram of a device following that of FIG. 3 in the manufacturing method of a semiconductor integrated circuit device according to the one embodiment of the present application (a tungsten CVD step)
Figure 8:
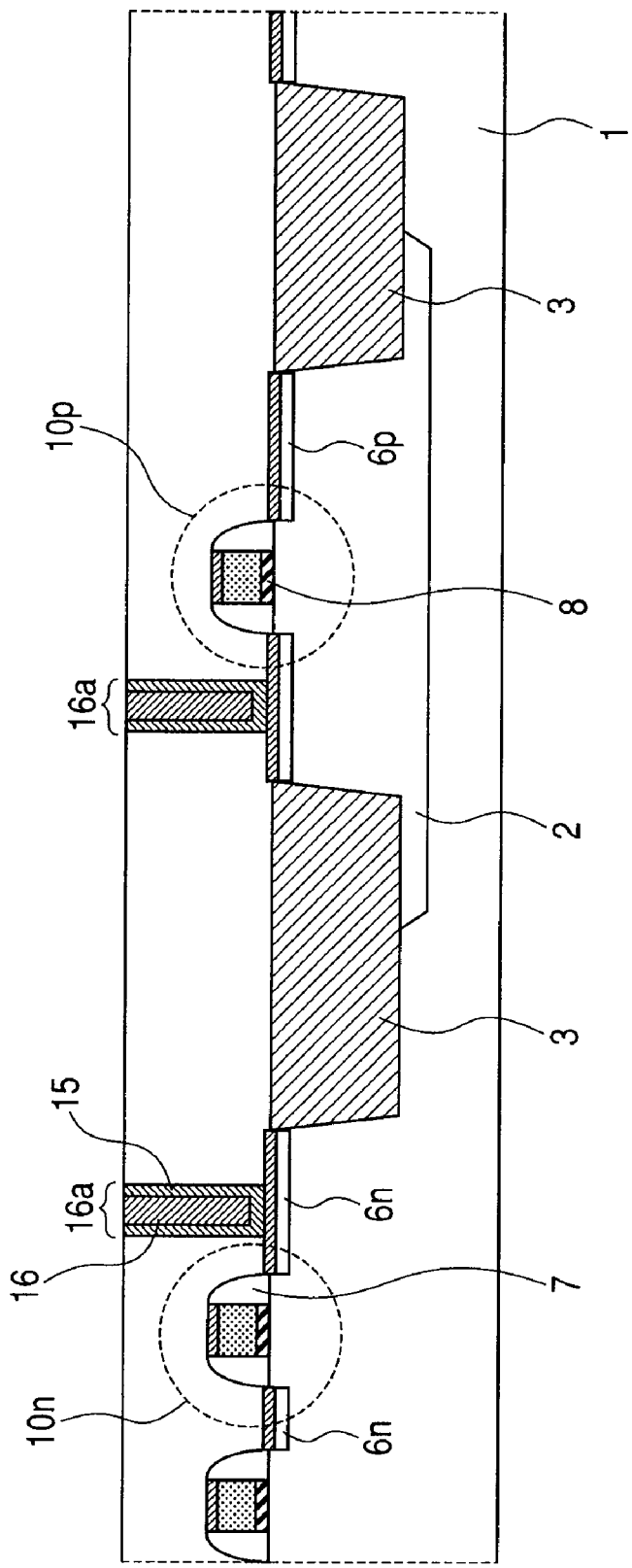
FIG. 8 is a cross-sectional flow diagram of a device in the manufacturing method of a semiconductor integrated circuit device according to one embodiment of the present application (a metal CMP step)
Figure 9:
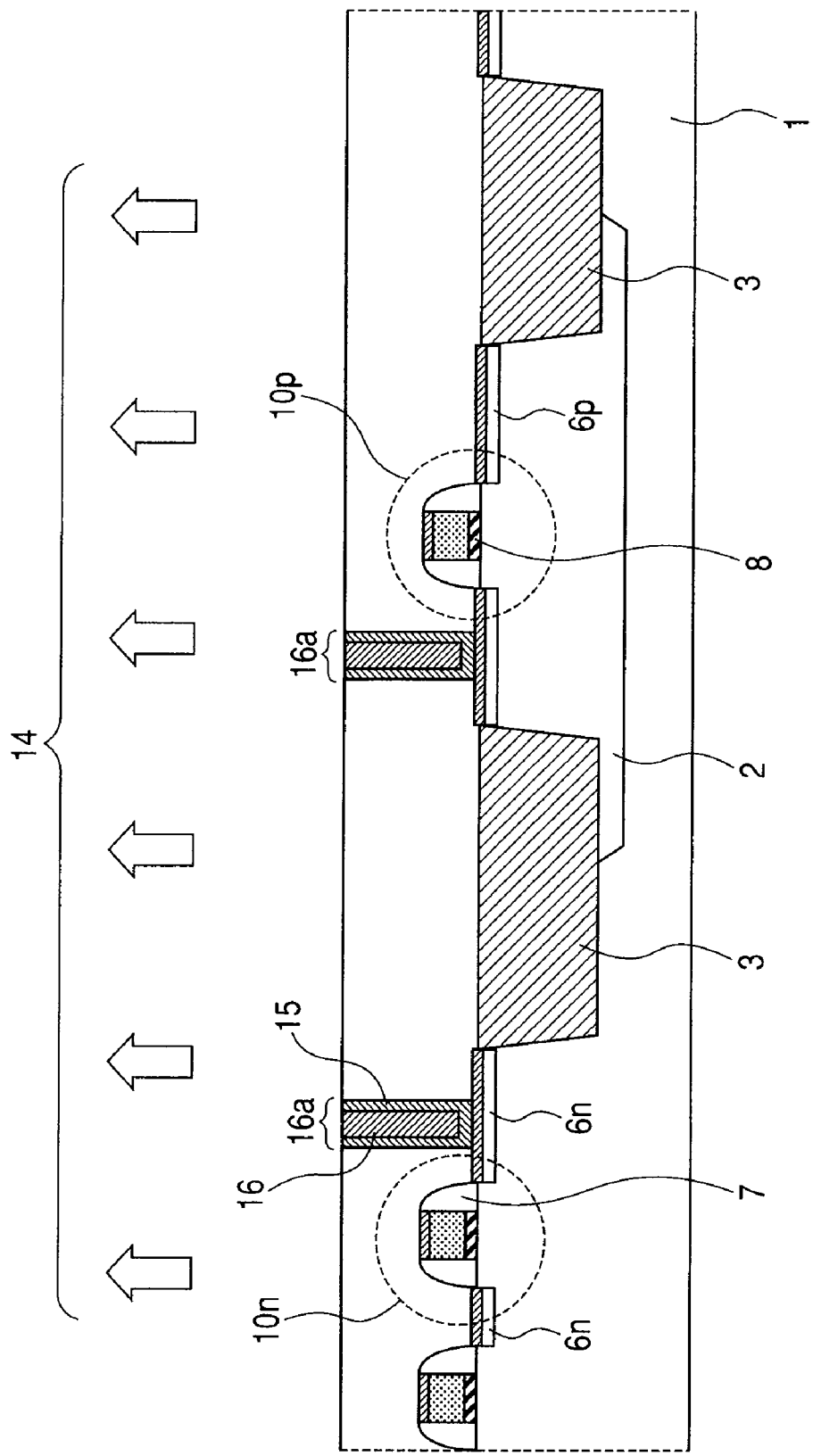
FIG. 9 is a cross-sectional flow diagram of a device in the manufacturing method of a semiconductor integrated circuit device according to the one embodiment of the present application (a degassing step before tungsten sputtering for the formation of a first-level metal interconnect)

As illustrated in FIG. 7, a thick tungsten film (about 350 nm thick) is formed over the thin seed tungsten film by CVD processing in the processing chamber 39 (FIG. 14) to fill the contact hole 12 (FIG. 12) completely. The wafer 1 is then taken out from the multi-chamber type wafer processing apparatus 30 and transported to a CMP (chemical mechanical polishing) apparatus, where the wafer is subjected to metal CMP processing as illustrated in FIG. 8 to complete formation of a tungsten plug 16a. After completion of necessary post CMP cleaning and the like, the wafer 1 is transported again to the multi-chamber type wafer processing apparatus 30 (which may be another apparatus) and is subjected to the degassing processing 14 as illustrated in FIG. 9 in the degas processing chamber 35 (which may be another chamber in the same apparatus or may be another apparatus). Degas processing is performed, for example, by heating the wafer 1 with a lamp for from about 50 to 100 seconds under high vacuum (achieving temperature of from about 200° C. to 300° C.).

The wafer is then transported to the processing chamber 40 (which may be another chamber in the same apparatus or may be another apparatus), in which a tungsten sputtering film 17 (about 100 nm thick), a principal interconnect layer of a first-level interconnect, is formed by sputtering film formation with a tungsten target. Film formation is performed, for example, under the following conditions: a stage temperature: about 400° C., atmospheric pressure in the chamber: about 600 mPa (4.5 mTorr), flow rate of argon: about 86 sccm, DC power: about 2 KW, and film formation time: about 37 seconds.

Figure 10:
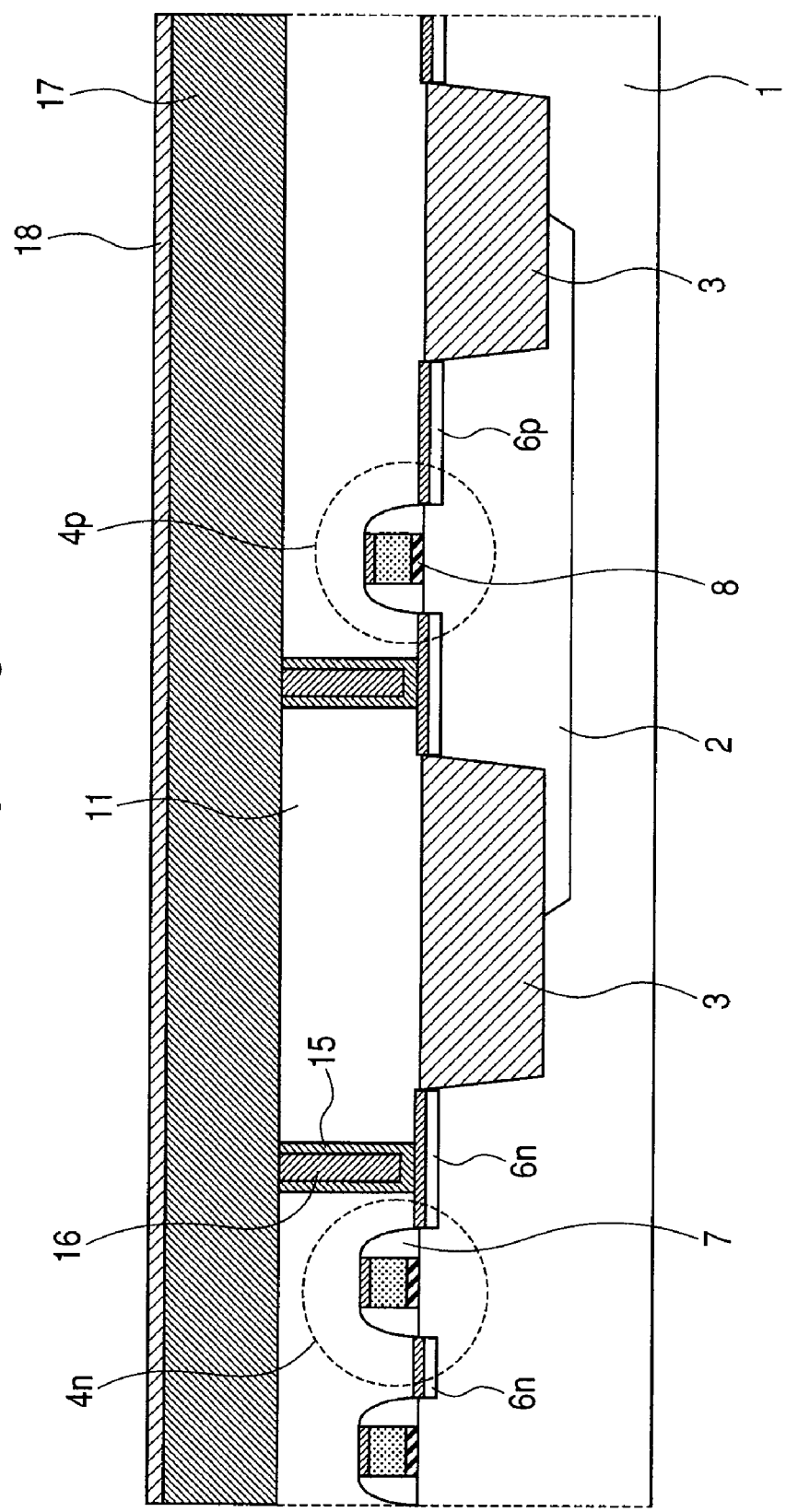
FIG. 10 is a cross-sectional flow diagram of a device in the manufacturing method of a semiconductor integrated circuit device according to the one embodiment of the present application (a sputtering step for forming a metal film structure of the first-level metal interconnect)

The wafer is then transported to the processing chamber 37 (which may be another chamber of the same apparatus or may be another apparatus), in which as illustrated in FIG. 10, the titanium nitride film 18 as an antireflective film against the tungsten sputtering film 17, that is, a principal interconnect layer of the first-level interconnect is formed by reactive sputtering film formation (which may be effected by CVD) with a titanium target.

Figure 11:
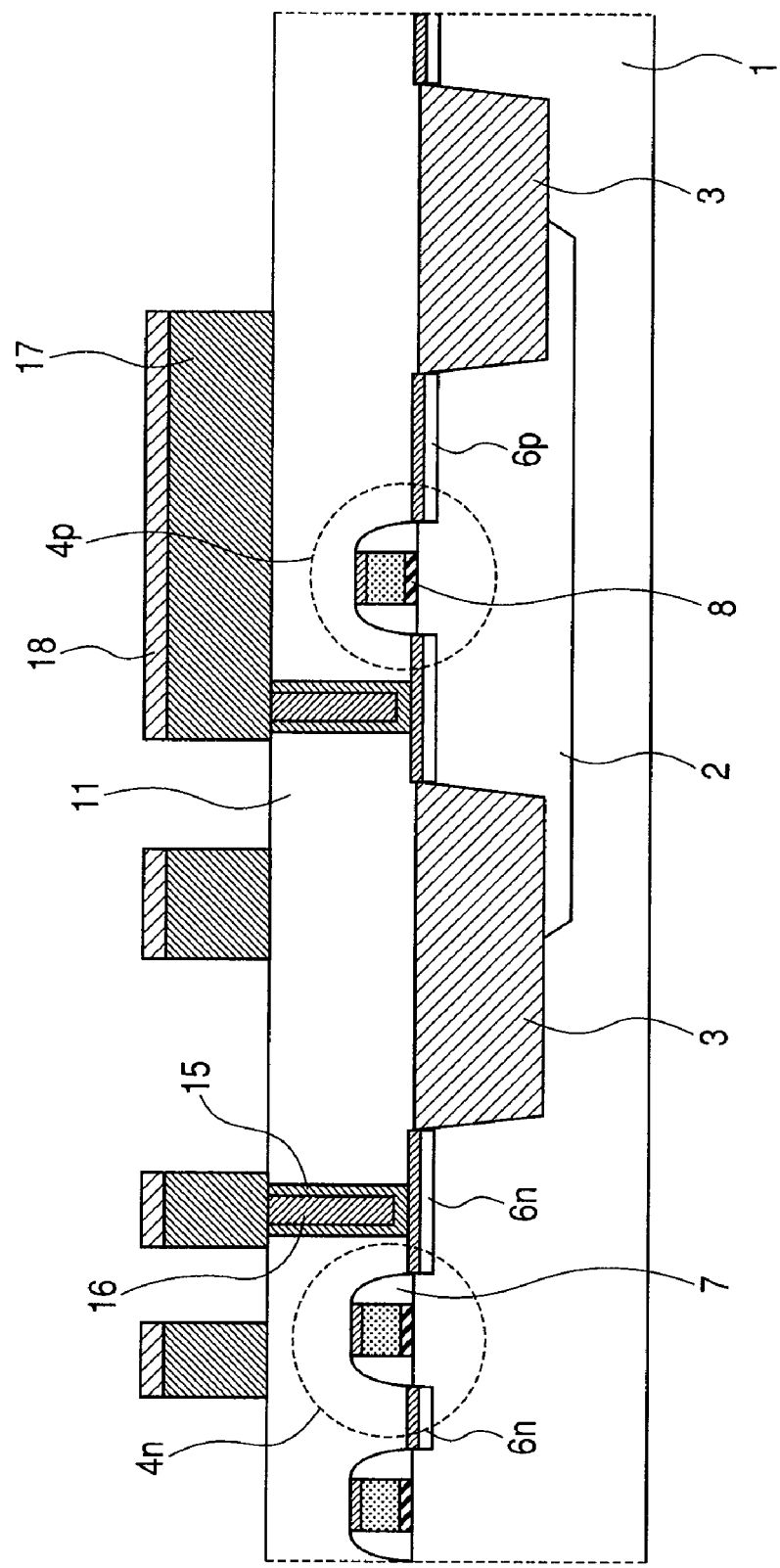
FIG. 11 is a cross-sectional flow diagram of a device in the manufacturing method of a semiconductor integrated circuit device according to the one embodiment of the present application (upon completion of patterning of the first-level tungsten-based metal interconnect)

Then, typical lithography is performed to pattern the first-level tungsten interconnect including the tungsten sputtering film 17 and the titanium nitride film 18 as illustrated in FIG. 11.

Then, a necessary tungsten plug and an aluminum-based multilayer interconnect structure comprised of an aluminum-based interconnect or a copper-based (silver-based) damascene interconnect structure are formed in a similar manner.

Figure 12:
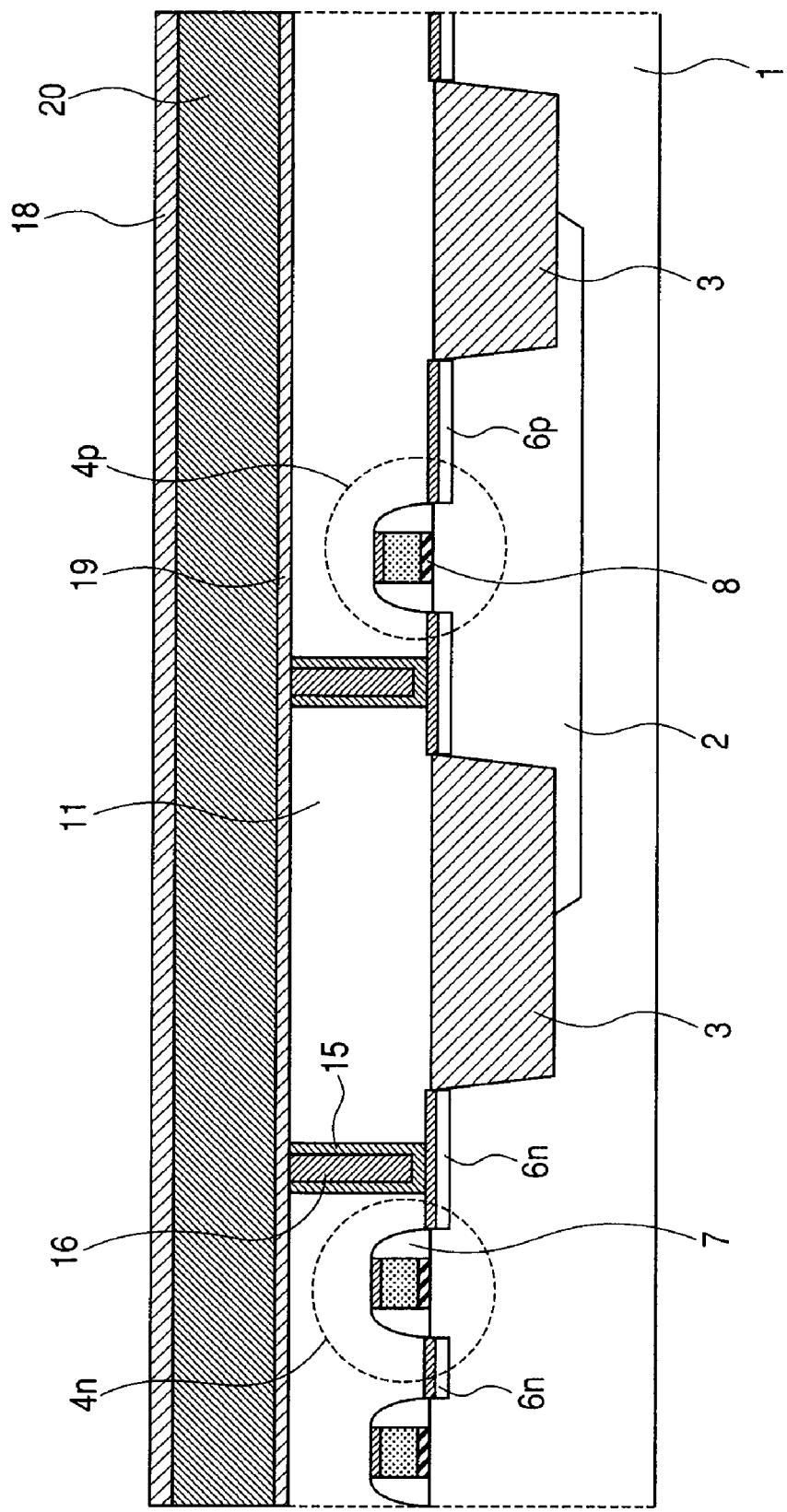
FIG. 12 is a cross-sectional flow diagram of a device in the manufacturing method of a semiconductor integrated circuit device (common from FIGS. 1 to 9) according to another embodiment (second embodiment, which will equally apply hereinafter) of the present application (a sputtering film-formation step to form a metal film structure for a first-level aluminum-based metal interconnect)
Figure 13:
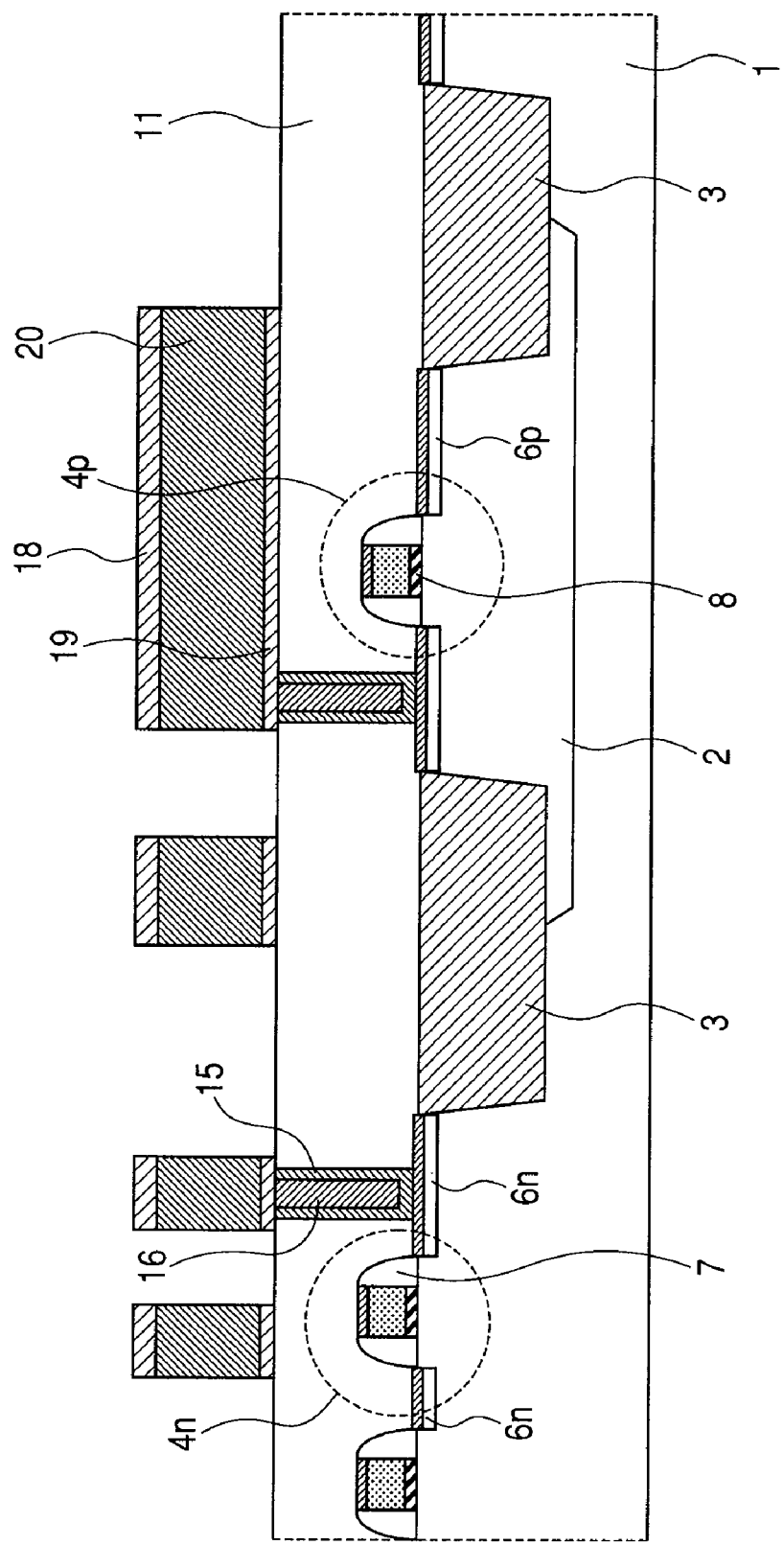
FIG. 13 is a cross-sectional flow diagram of a device in the manufacturing method of a semiconductor integrated circuit device (common from FIGS. 1 to 9) according to the another embodiment of the present application (upon completion of patterning of the first-level aluminum-based metal interconnect)

3. Explanation of cross-sectional flow diagrams of a device (mainly FIGS. 12 and 13 and FIGS. 1 to 9 are common to both sections 2 and 3) in a manufacturing method of a semiconductor integrated circuit device according to another embodiment (second embodiment "aluminum-based M1 process", which will equally apply hereinafter) of the present application Steps illustrated in from FIG. 1 to FIG. 9 are common to both Section 2 and this section so that overlapping description is omitted (steps after FIG. 13 are also common to Section 2 and this section). Steps after degas processing illustrated in FIG. 9 will next be described (completion of degas processing by that in the degas processing chamber 35 illustrated in FIG. 14). As illustrated in FIG. 12, a lower barrier metal film 19, which is relatively thin, is formed by sputtering film formation in, for example, the processing chambers 36 and 37 as illustrated in FIG. 12. An aluminum-based principal interconnect layer 20 (usually having aluminum as a main component and containing copper, silicon, or another additive in an amount of several %), which is a principal interconnect layer and is relatively thick, is formed by sputtering film formation over the lower barrier metal film for example in the processing chamber 40. Then, for example, in the processing chambers 36 and 37, the upper barrier metal film 18 (partially, an antireflective film), which is relatively thin, is formed over the aluminum-based principal interconnect layer 20 by sputtering film formation or the like. Barrier metal films 18 and 19 are usually made of a lower titanium film and an upper titanium nitride film.

As illustrated in FIG. 13, typical lithography is then performed to pattern the first-level aluminum-based interconnect including the lower barrier metal film 19, the aluminum-based principal interconnect layer 20, and the upper barrier metal film 18.

4. Explanation of pulse signal processing upon moisture monitoring at the time of sputtering film formation (mainly FIGS. 17 to 20, and FIG. 16).

Figure 17:
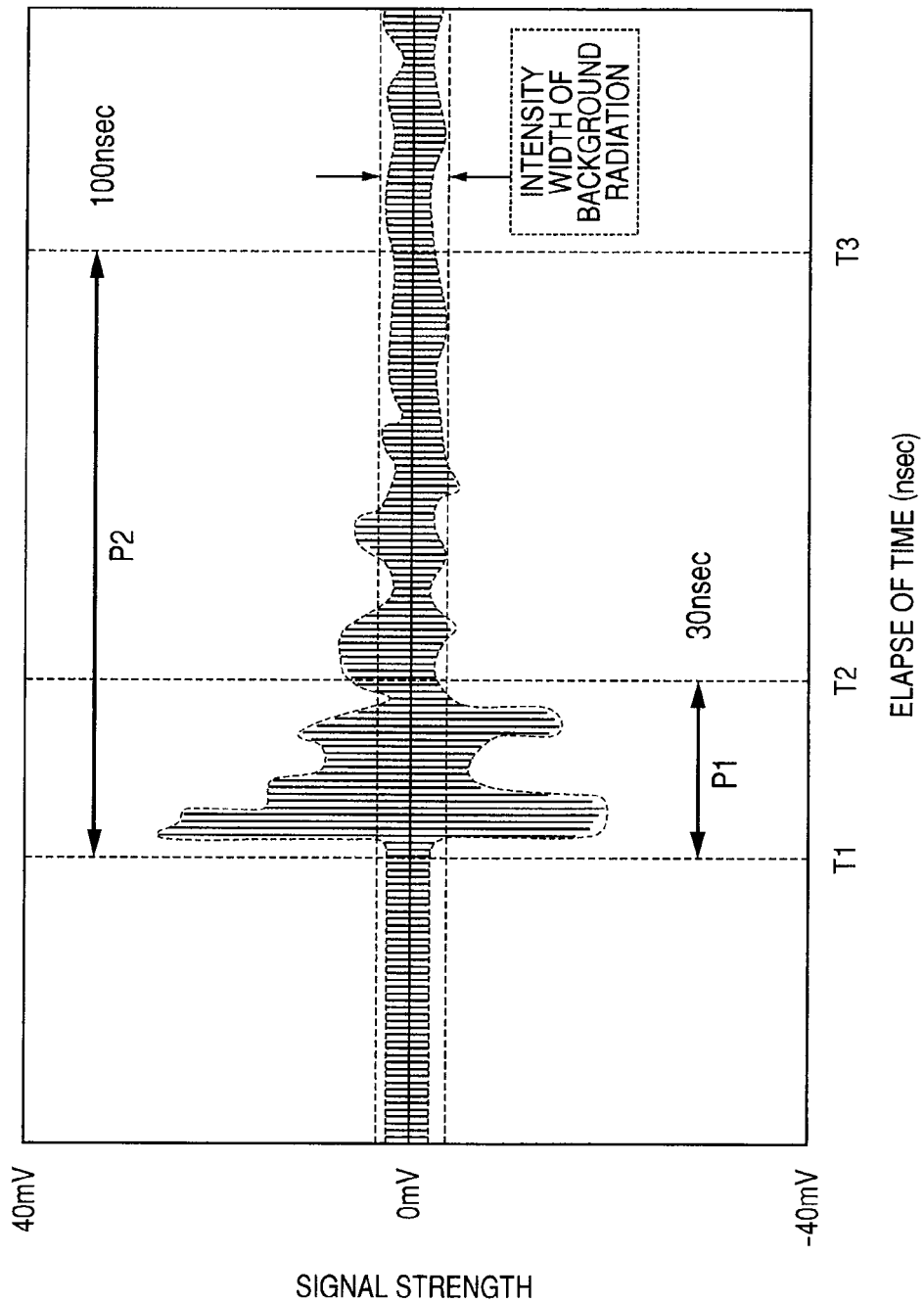
FIG. 17 is a pulse waveform showing an actual example of a pulse signal upon moisture monitoring at the time of film formation by sputtering.

Referring to FIG. 16 used in Section 1 for explanation, an example of actual received signal 57 and the like will next be explained. The actual received signal 57 including a pulse derived from moisture is as illustrated in FIG. 17. Described specifically, it includes relatively flat plasma background radiation (radio waves radiated as a result of natural plasma fluctuations) having a wave height not greater than about several mm volts; a short pulse signal derived from moisture or the like, having typically a pulse duration of from about 30 nanoseconds (a short-pulse duration P1) to 100 nanoseconds (a long-pulse duration P2) (not greater than 5 microseconds, that is, 5000 nanoseconds at most), and having a wave height higher than that of the former one; and a long-pulse signal (too long to be illustrated in the diagram) having a signal strength comparable to that of a short-pulse signal, having a sufficiently longer pulse (typically, exceeding 100 microseconds) than that of the above-mentioned signal and resulting from abnormal discharge. When attention is paid to the short-pulse duration P1 (lower limit of a pulse duration of one example of a pulse derived from moisture), that is, a term from Time T1 to Time T2, it can be regarded that the term of the short-pulse duration P1 corresponds to disturbance directly resulting from rotational spectrum radiation of water molecules and a term within the long-pulse duration P2 but after the short-pulse duration P1, that is a term from Time T2 to Time T3 corresponds to secondary disturbance. In consideration of them, it is presumed that a pulse duration is preferably a term from immediately before Time T1 when a wave height drastically increases from the state of only background radiation to Time T3 when secondary disturbance falls within the strength range of the background radiation. Even this term is about 100 nanoseconds and is sufficiently small compared with the upper limit, that is, 5000 nanoseconds (5 microseconds).

Figure 18:
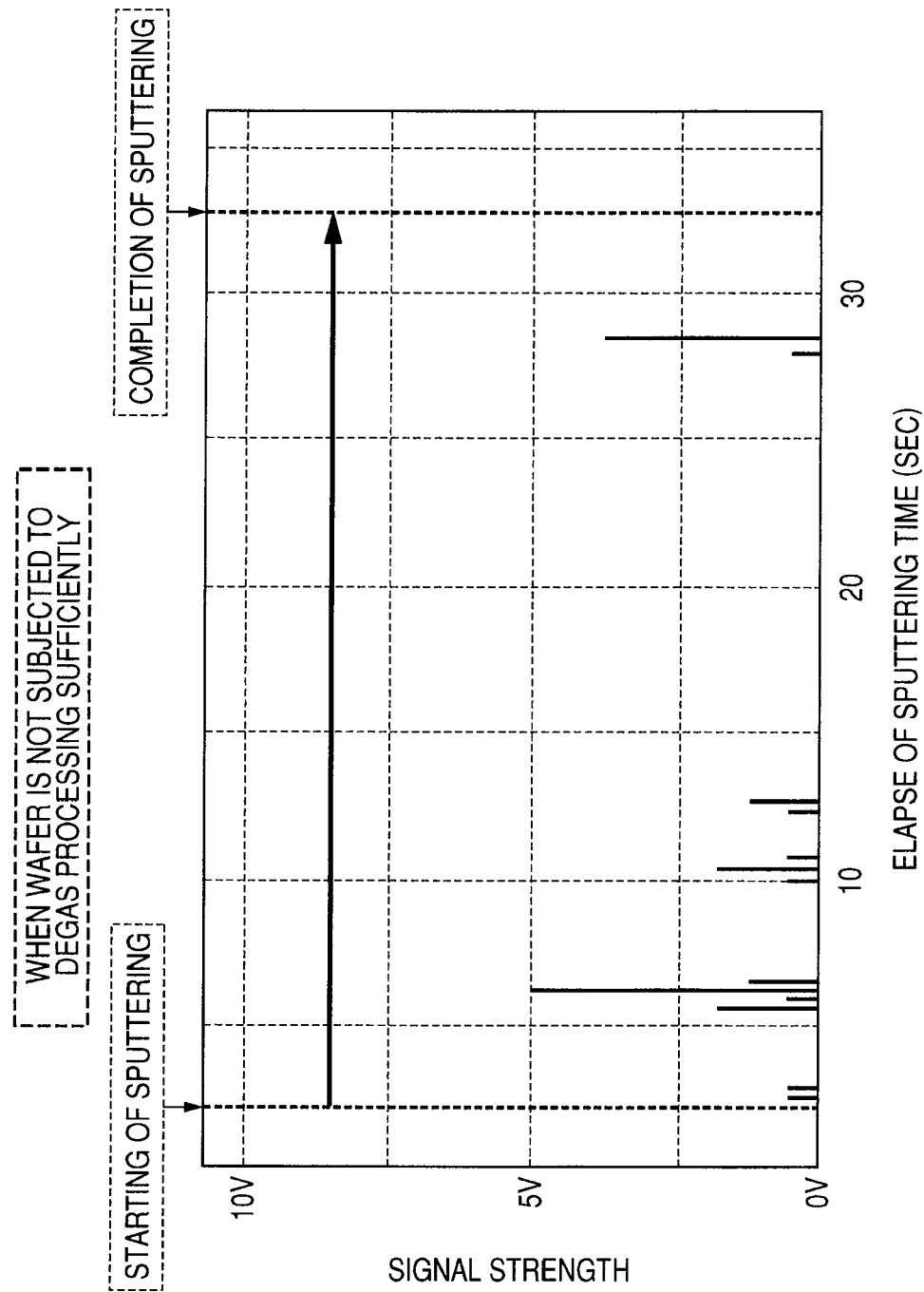
FIG. 18 is a pulse waveform showing an actual example of a pulse signal extracted during an entire sputtering period upon moisture monitoring at the time of film formation by sputtering (when sufficient degassing is not performed)

Time-series output of a maximum value measurement 73 illustrated in FIG. 16 when the wafer 1 not degassed sufficiently is subjected to sputtering film-formation processing in an apparatus as illustrated in FIG. 15 is illustrated in FIG. 18 (a dynamic range is set from 0V to 10V).

Figure 19:
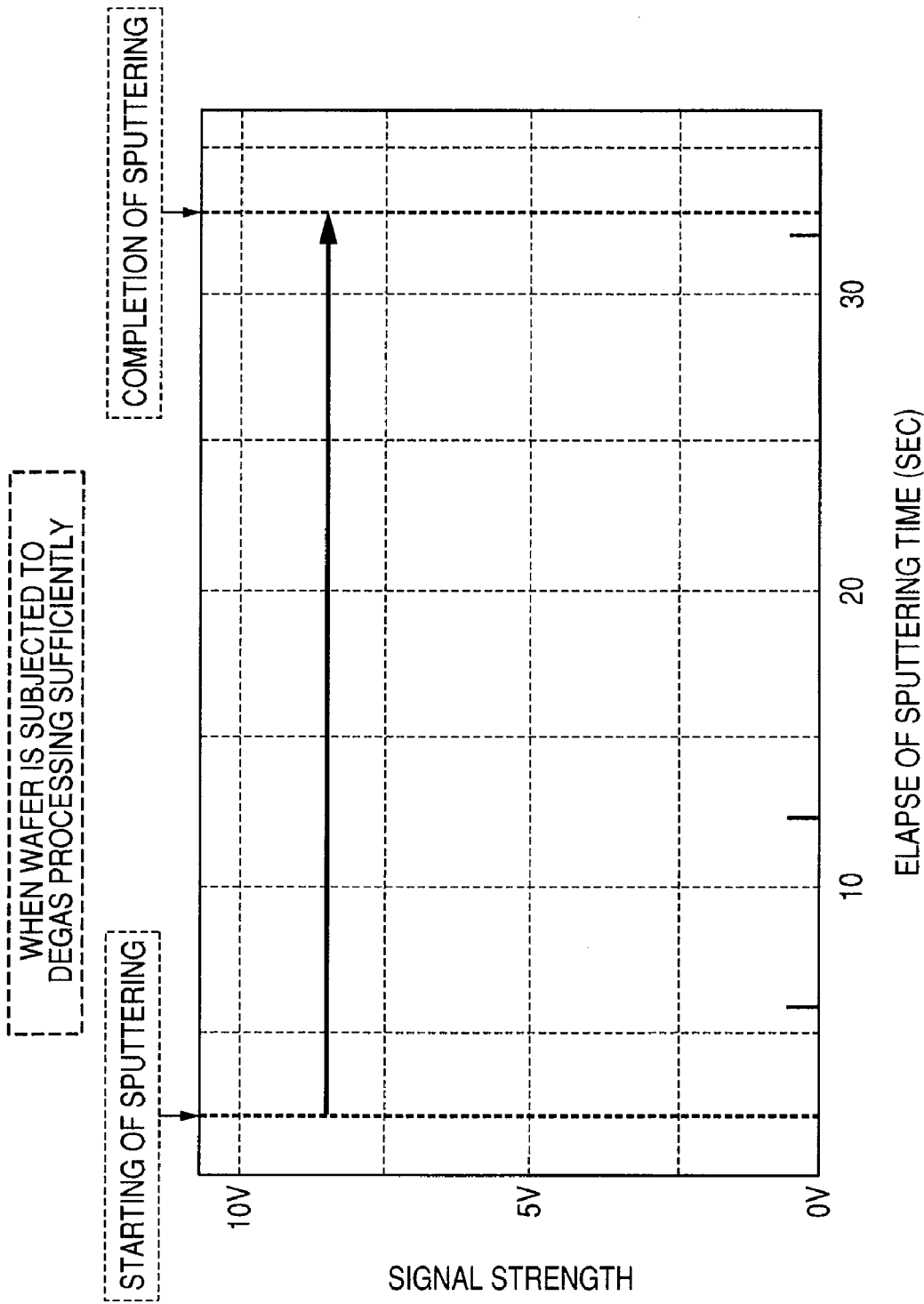
FIG. 19 is a pulse waveform showing an actual example of a pulse signal extracted during an entire sputtering period upon moisture monitoring at the time of film formation by sputtering (when sufficient degassing is performed)

On the other hand, time-series output of the maximum value measurement 73 illustrated in FIG. 16 when the wafer 1 degassed sufficiently is subjected to sputtering film-formation processing in an apparatus as illustrated in FIG. 15 is illustrated in FIG. 19 (a dynamic range is set from 0V to 10V).

Thus, it can be understood that many high wave-height peaks are observed from the wafer 1 not degassed sufficiently, while almost no high wave-height peaks are observed from the wafer 1 degassed sufficiently.

Figure 20:
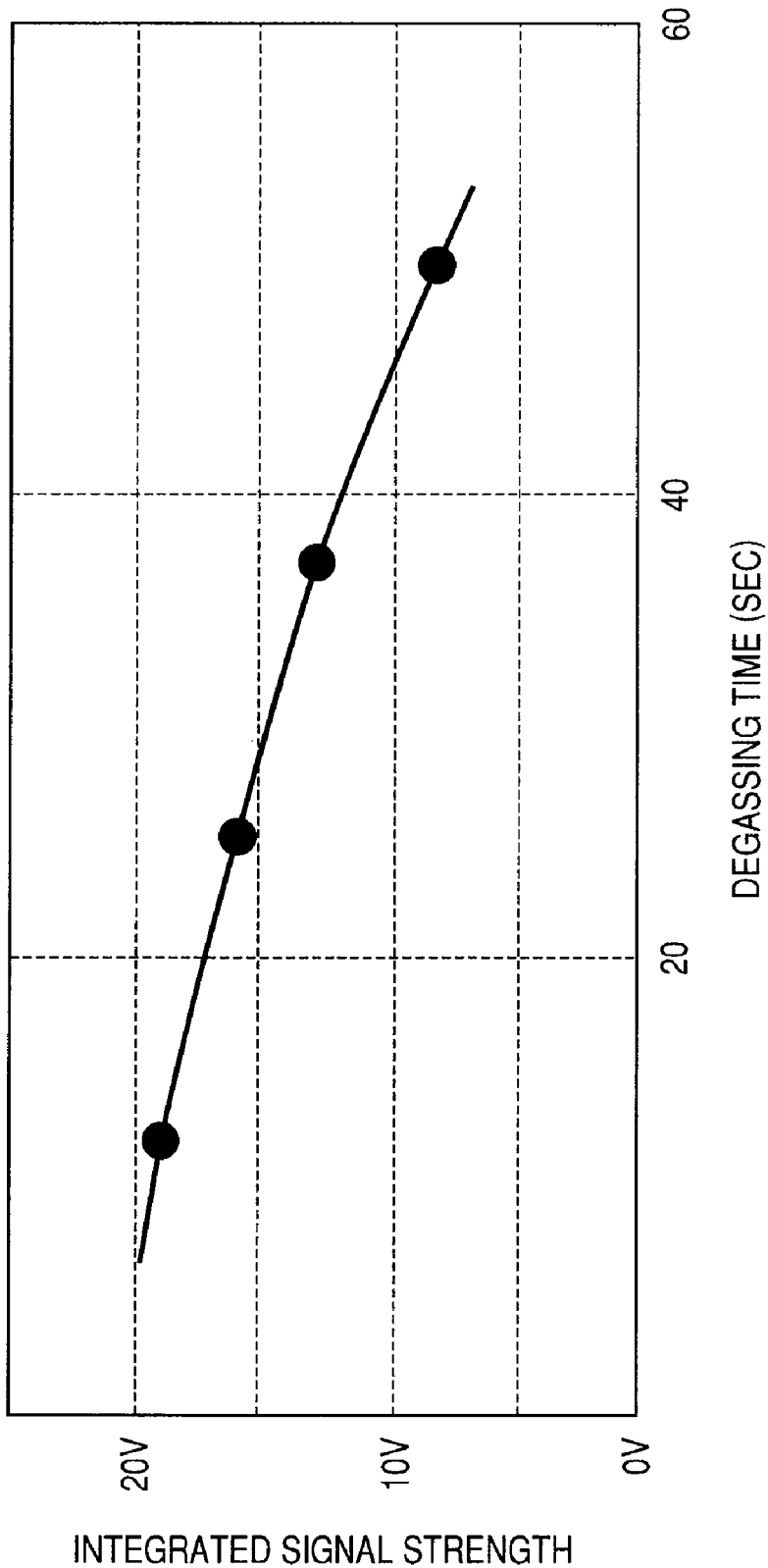
FIG. 20 is a correlation plot between degassing time before film formation by sputtering and integrated signal strength extracted by moisture monitoring at the time of film formation by sputtering.

In FIG. 20, a relationship between output of the integration processing 74 of FIG. 16 and degassing time is plotted. This drawing has revealed that with an increase in the degassing time, the integrated signal strength decreases.

5. Summary

Inventions made by the present inventors have been described specifically based on some embodiments, but the present invention is not limited to or by them. It is needless to say that the present invention can be changed without departing from the gist thereof.

For example, in the above embodiment, specific explanation was made using, as main examples, a tungsten plug formation process (particularly, the barrier metal formation process) in the pre-metal step, formation process of M1 tungsten-based interconnect layer, and formation process of M1 aluminum-based interconnect layer. The present invention is not limited to them and it is needless to say that it can be applied to a formation process of a tungsten plug between aluminum-based interconnect layers and copper damascene interconnection process.

In the above embodiments, as the barrier metal, a titanium-based barrier metal was specifically described. The present invention is not limited to it, but it is needless to say that the present invention can be applied to a tungsten-based, tantalum-based or ruthenium-based barrier metal containing a nitride (including a mixed crystal based one having the above metal as a main component). With regard to the formation of an interconnect layer, it is needless to say that the present invention can be applied to not only a tungsten-based one but also aluminum-based one (refer to Section 3), copper-based one, silver-based one, or the like. Moreover, it is needless to say that the present invention can be applied to the formation of another metal layer or another film having, as a main component thereof, gold, platinum, nickel, palladium, cobalt or the like (it may be an insulating film).

In the above embodiments, film formation by direct current sputtering was described specifically as an example, but the present invention is not limited thereto. It is needless to say that the present invention can also be applied to film formation by alternating current sputtering, ionization sputtering, or the like or gas-phase processing such as dry etching or CVD.

The invention claimed is:

1. A method for manufacturing a semiconductor integrated circuit device comprising the steps of:
    (a) introducing a wafer in a first processing chamber; and
    (b) after the step (a), exciting plasma in the first processing chamber to carry out gas phase processing of the wafer,
    wherein in the step (b), moisture in the first processing chamber is monitored by receiving, through an antenna arranged outside the first processing chamber, radio waves generated from the plasma in the first processing chamber,
    (c) wherein prior to the step (a), introducing the wafer in a second processing chamber in the wafer processing apparatus; and
    (d) wherein after the step (c) but prior to the step (a), subjecting the wafer to degas processing in the second processing chamber.

2. The method for manufacturing a semiconductor integrated circuit device according to claim 1, wherein the first processing chamber is in a multi-chamber type wafer processing apparatus.

3. The method for manufacturing a semiconductor integrated circuit device according to claim 1, wherein the gas phase processing is sputtering film-formation processing.

4. The method for manufacturing a semiconductor integrated circuit device according to claim 1, wherein the gas phase processing is sputtering film-formation processing of a metal film.

5. The method for manufacturing a semiconductor integrated circuit device according to claim 4, wherein the metal film has, as a principal component thereof, a component selected from the group comprised of titanium, tungsten, tantalum, and ruthenium, and nitrides thereof.

6. The method for manufacturing a semiconductor integrated circuit device according to claim 4, wherein the metal film has, as a principal component thereof, titanium or a nitride thereof.

7. The method for manufacturing a semiconductor integrated circuit device according to claim 4, wherein the metal film has, as a principal component thereof, tungsten or a nitride thereof.

8. The method for manufacturing a semiconductor integrated circuit device according to claim 1, wherein a band range of the radio waves is 1 GHz or greater but not greater than 6 GHz.

9. The method for manufacturing a semiconductor integrated circuit device according to claim 1, wherein the radio waves have a pulse duration of 5 microseconds or less.

10. The method for manufacturing a semiconductor integrated circuit device according to claim 1, wherein the radio waves have a pulse duration of 100 microseconds or less.

* * * * *